(12) United States Patent
Makino et al.

(10) Patent No.: US 7,683,319 B2
(45) Date of Patent: Mar. 23, 2010

(54) CHARGE CONTROL APPARATUS AND MEASUREMENT APPARATUS EQUIPPED WITH THE CHARGE CONTROL APPARATUS

(75) Inventors: Hiroshi Makino, Kokubunji (JP); Zhaohui Cheng, Tokyo (JP); Kenji Tanimoto, Hitachinaka (JP); Hideo Todokoro, Hinode (JP)

(73) Assignee: Hitachi High-Technologies Corporation, Tokyo (JP)

( * ) Notice: Subject to any disclaimer, the term of this patent is extended or adjusted under 35 U.S.C. 154(b) by 134 days.

(21) Appl. No.: 11/338,843

(22) Filed: Jan. 25, 2006

(65) Prior Publication Data
US 2009/0166557 A1 Jul. 2, 2009

(30) Foreign Application Priority Data
Jan. 26, 2005 (JP) ............................. 2005-017596
Oct. 13, 2005 (JP) ............................. 2005-298311

(51) Int. Cl.
*H01J 37/256* (2006.01)
(52) U.S. Cl. ............. 250/310; 250/442.11; 250/492.21; 324/750
(58) Field of Classification Search .................. 250/310
See application file for complete search history.

(56) References Cited

U.S. PATENT DOCUMENTS

| | | | | |
|---|---|---|---|---|
| 5,329,125 A | * | 7/1994 | Feuerbaum | 250/442.11 |
| 5,612,626 A | * | 3/1997 | Golladay | 324/751 |
| 6,091,249 A | * | 7/2000 | Talbot et al. | 324/751 |
| 6,593,152 B2 | * | 7/2003 | Nakasuji et al. | 438/14 |
| 6,765,219 B2 | * | 7/2004 | Berrian et al. | 250/492.21 |
| 7,049,739 B2 | * | 5/2006 | Jin et al. | 313/495 |

FOREIGN PATENT DOCUMENTS

| | | |
|---|---|---|
| JP | 10-294345 | 11/1998 |
| JP | 2000-173528 | 6/2000 |
| JP | 2000-208085 | 7/2000 |
| JP | 2003-202217 | 7/2003 |
| JP | 2004-014485 | 1/2004 |

\* cited by examiner

*Primary Examiner*—David A. Vanore
*Assistant Examiner*—Phillip A. Johnston
(74) *Attorney, Agent, or Firm*—Antonelli, Terry, Stout & Kraus, LLP.

(57) ABSTRACT

The invention solves charge nonuniformity of a specimen surface resulting from emission variation of a carbon nanotube electron source and individual difference of emission characteristics. During charge control processing, charge of the specimen surface is measured in real time. As means for solving charge nonuniformity resulting from nonuniformity of electron illumination density, electrons illuminating the specimen and the specimen are moved relatively to average electron illumination density. Moreover, an absorption current flowing into the specimen and the numbers of secondary electrons emitted from the specimen and of backscattered electrons are measured as means for monitoring charge of the specimen surface in real time.

14 Claims, 26 Drawing Sheets

※) WAFER IS MOVING PERPENDICULARLY TO PAPER

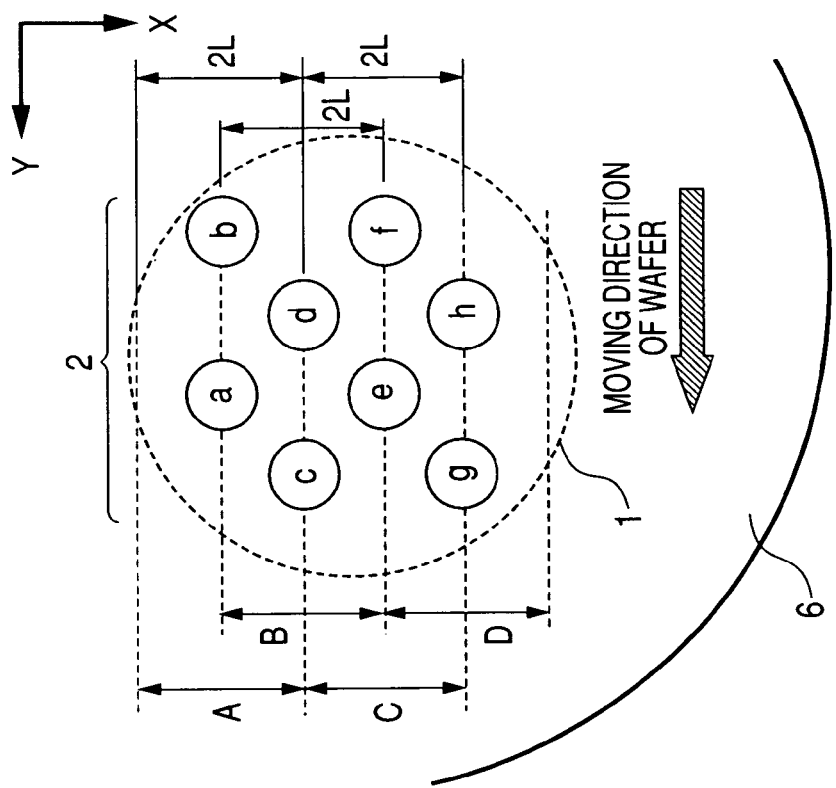
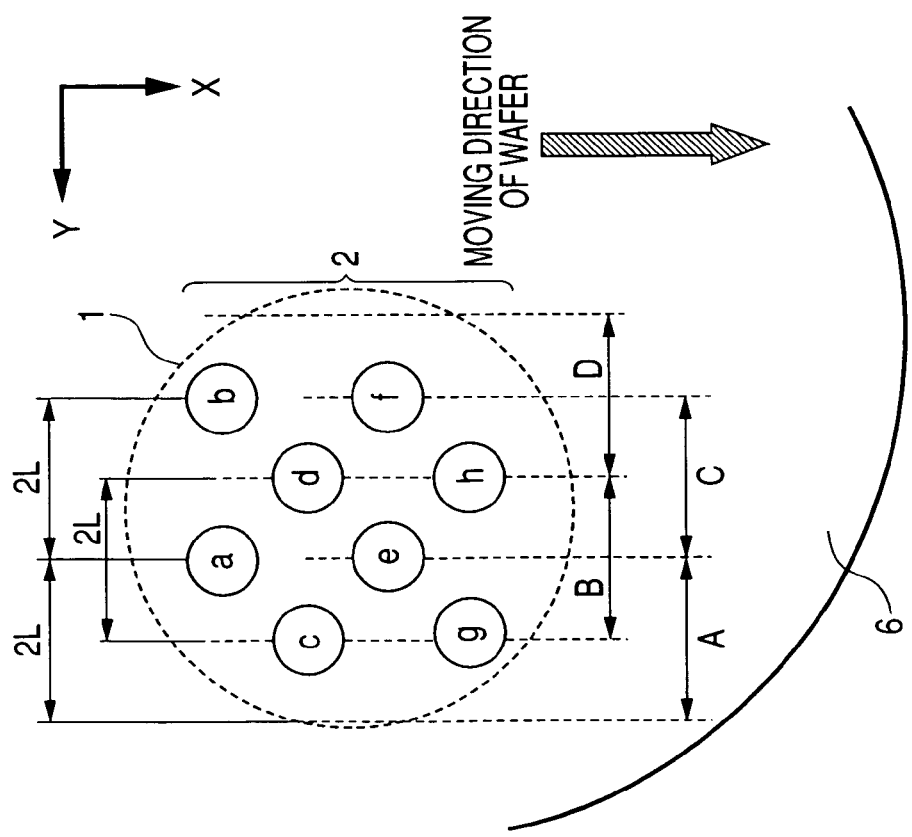

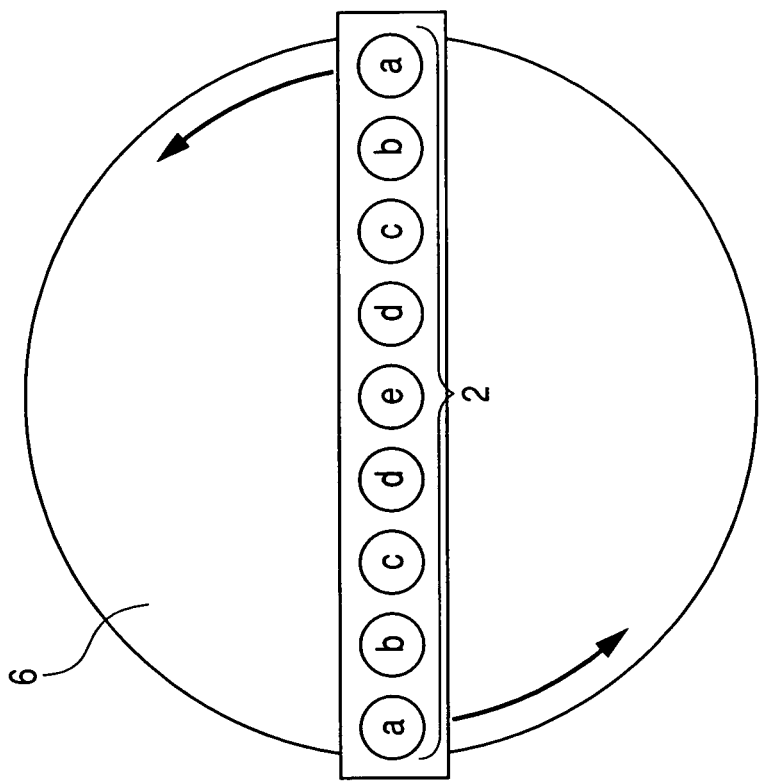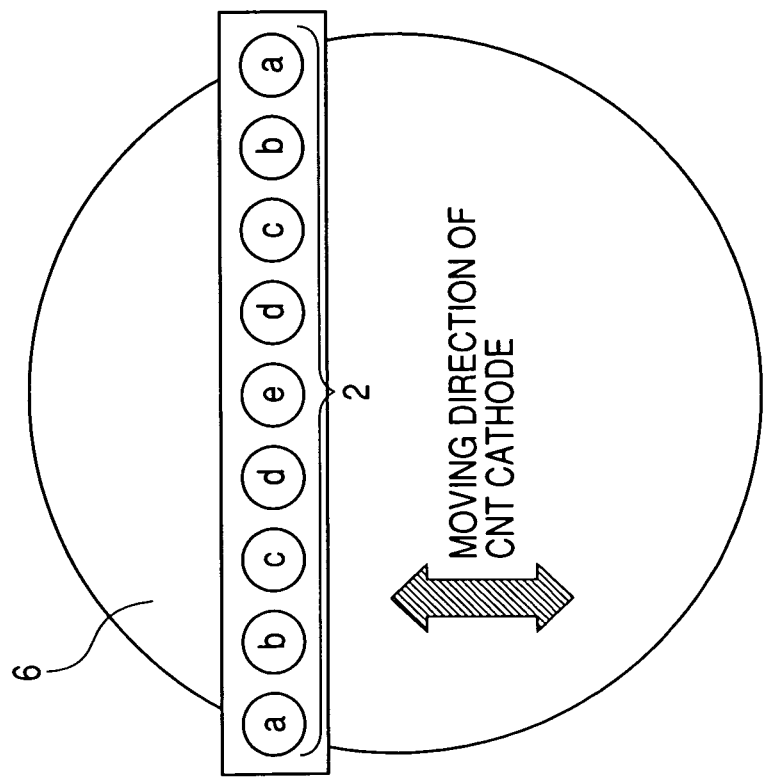

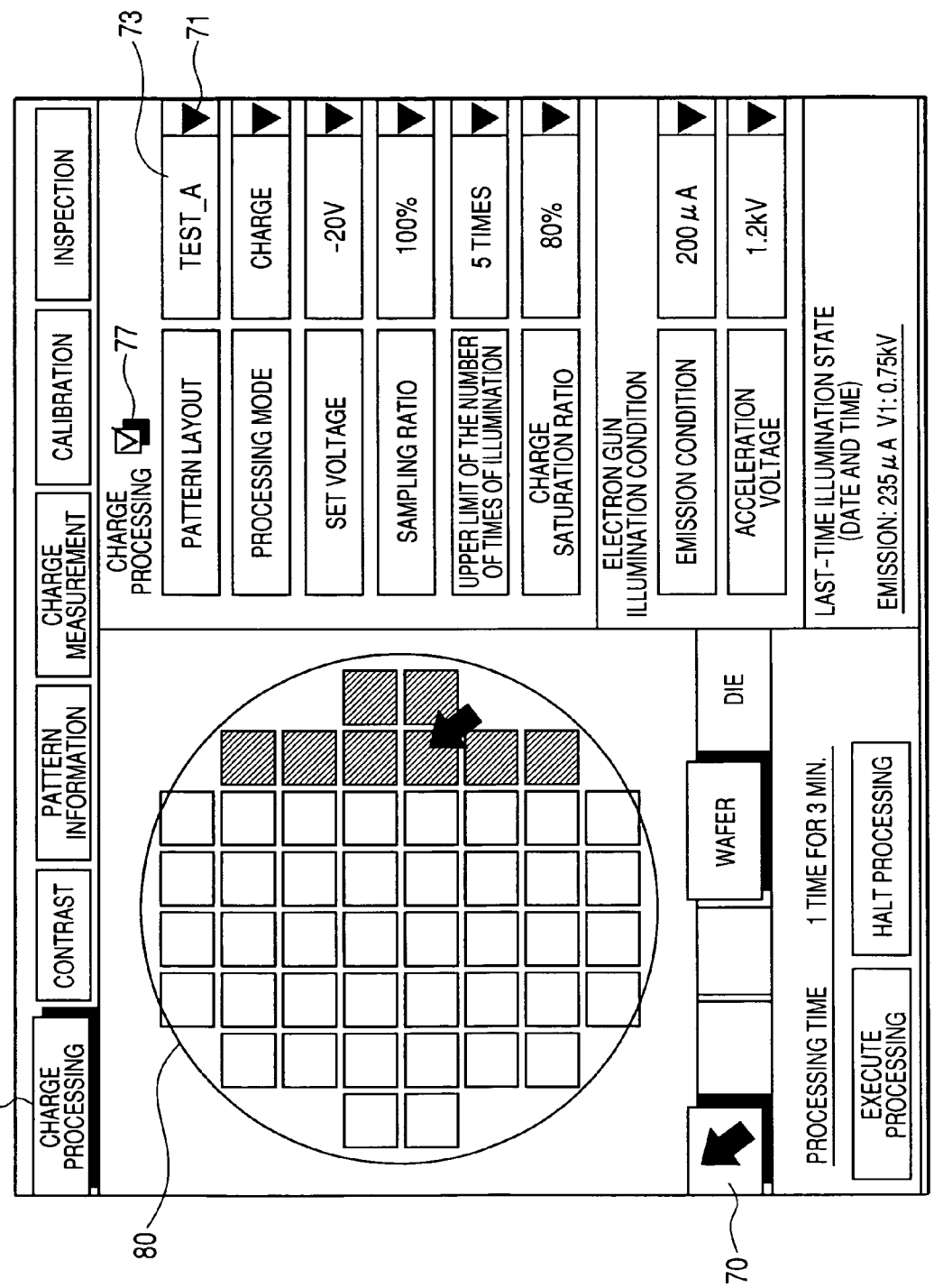

CHARGE CONTROL APPARATUS AND MEASUREMENT APPARATUS EQUIPPED WITH THE CHARGE CONTROL APPARATUS

CLAIM OF PRIORITY

The present application claims priority from Japanese application JP 2005-017596 filed on Jan. 26, 2005, and JP 2005-298311 filed on Oct. 13, 2005, the contents of which are hereby incorporated by reference into this application.

FIELD OF THE INVENTION

This invention relates to a measurement apparatus and a measurement method for controlling a potential of the surface of a specimen constructed with a pattern including an insulator on its surface, such as a semiconductor device and a liquid crystal device, and a measurement apparatus for a semiconductor device, a liquid crystal device, etc. having the charge control device (charge control apparatus) and a measuring method therefor.

BACKGROUND OF THE INVENTION

In these days, a technology of measuring a state of a circuit pattern formed on a wafer during a process assumes an important role in a manufacture line of a semiconductor device. Conventionally, most of these measuring technologies are ones that are based on optical microscopes. However, in order to be compatible with miniaturization of semiconductor devices and complication of manufacturing processes in recent year, measurement apparatus based on the electron microscope are being popularized. However, since generally surfaces of circuit patterns are constructed with an insulating film made of $SiO_2$, SiN, a polymer, such as a resist, or the like, there is a problem that, if circuit patterns are measured using charged particles, such as an electron beam, surfaces of semiconductor devices are electrified and accordingly measurement precision may deteriorate. Therefore, in the case where a specimen, such as a semiconductor device, whose surface is prone to be electrified is measured, it is important to control charge of the surface of the specimen in order to prevent degradation in measurement precision. In addition, in the inspection of semiconductor devices, there arise needs of inspection for failures of electric characteristics, such as conduction and non-conduction, that are difficult to detect with optical inspection instruments, and consequently electron beam type inspection instruments are coming into wide use. When this electron beam type inspection instrument detects defects of electric characteristics of the semiconductor device, a circuit pattern formed on a wafer surface is electrified and contrast that becomes manifest thereby is used for the detection. This is called the voltage contrast method and is effective means to detect failures of electric characteristics of semiconductor devices. In order to perform the inspection using this voltage contrast method with excellent repeatability and with high precision, it is necessary to manage charge of a circuit pattern that is a target of inspection. Increase in this control precision directly leads to improvement of detection precision of failures of electric characteristics.

JP-A No. 294345/1998 discloses a processing method for rendering charge of a wide range of areas including a measured area uniform for a time other than acquiring time of an image, as a method for controlling charge of a specimen surface. This processing does not need to be the same as that of a light source used in the measurement, and the processing of rendering charge uniform can be performed by disposing other light sources, such as an electron source, an ion source, a plasma source, and a light source, for uniform processing.

Moreover, JP-A No. 208085/2000 discloses a method for controlling charge using a charge control electrode. This method uses an electron source for a light source for charge processing, and energy of a primary electron is adjusted so that the number of secondary electrons emitted from a specimen may become larger than the number of the primary electrons incident on the specimen. In addition, using the charge control electrode disposed right above the illumination area, a potential difference between the specimen and the electrode is maintained at a desired potential, whereby charge control is conducted.

JP-A No. 173528/2000 discloses a method for controlling charge where a variation in an electrified state of a specimen is sensed by monitoring temporal variation of an acquired voltage contrast image and charge control is conducted by altering illumination energy of a primary electron beam that irradiates the specimen.

In light of improving efficiency of a manufacture process of a semiconductor device, it is preferable that charge control processing is conducted as quickly as possible. In order to increase a processing speed of charge control, a light source that can irradiate a large area at one time using a large current is suitable. Although general electron sources have been proven and guaranteed for their stable operations, many of them operate in an ultra high vacuum ($<1\times10^{-6}$ [Pa]) (for example, the field emission type electron source and the Schottky emission type electron source) or at a temperature of 1000K or higher (for example, $LaB_6$, the W filament type electron source). They are too massive to install separately as a second electron source, and needs a lens etc. to irradiate a large area at one time. As one of electron sources satisfying such requirements, there is a Carbon NanoTube electron source (hereinafter, abbreviated as CNT cathode). JP-A No. 202217/2003 discloses a technology of equalizing charge of a wafer using the CNT cathode.

Naturally it is important to observe or detect an electrified state of a specimen during processing of charge in performing charge processing efficiently. However, observation means suitable for an inspection instrument of a semiconductor device did not exist conventionally. Although there was a surface electrometer as means for observing an electrified state of the specimen surface, the electrometers could not be placed at the same position as a point where charge processing was performed, and consequently it can be used only in a procedure of using the electrometer after charge processing. In this case, since charge processing and potential measurement cannot be conducted simultaneously, whether charge of the surface by charge processing has reached saturation cannot be determined and hence determination as to whether charge processing is completed is impossible. Therefore, it is unsuitable to apply this system to the semiconductor measurement apparatus that is required high-precision ad high-speed charge control. Moreover, although JP-A No. 173528/2000 discloses a technology of detecting an electrified state by monitoring a variation in voltage contrast of an acquired image, it comes with a necessity of performing image processing each time an electrified state is analyzed, and consequently it does not match high-speed of processing. Moreover, since there is the case where charge of a specimen varies in acquiring an image, applying the technology of JP-A No. 173528/2000 to a charge monitor needs a caution.

Moreover, although the above-mentioned JP-A No. 294345/1998 and JP-A No. 202217/2003 discloses a technology of performing charge processing using a charged particle beam source different from the primary electrons as means for realizing charge processing, a technology where an electrified state is observed and charge processing or charge control is performed based on its results is not disclosed.

SUMMARY OF THE INVENTION

In view of this, the present invention has an object to perform charge processing efficiently by observing an electrified state by predetermined observation means and feeding back observation results to a charged particle beam illumination system installed separately from the primary electron beam illumination system.

In order to solve the above-mentioned problem, in the charge control apparatus of this invention, electrons illuminating a specimen and the specimen are relatively moved so that ununiformity of charge resulting from variation of an emission current is reduced, and at the same time charge is monitored. The means for relatively moving electrons and the specimen is at least one means selected from among means for scanning an electron beam using a deflector, means for moving an electron source, and means for moving a specimen, or a combination of two or more means. The means for monitoring charge of a specimen is at least one means selected from among means for monitoring an absorption current flowing into the specimen, means for, when using an charge control electrode, monitoring an absorption current flowing into the electrode, and means for monitoring the secondary electrons emitted from the specimen and backscattered electrons, or a combination of two or more means. By the relative movement, arbitrary charge including 0 V can be given to the specimen uniformly and with high speed. Then, by applying the charge control apparatus of this invention to a measurement apparatus using charged particles, improvement in both measurement precision of the measurement apparatus and repeatability can be realized. Moreover, in the case where the charge control apparatus is applied to an inspection instrument for semiconductor using charged particles, high-sensitivity detection of a failure of electric characteristics can be realized.

BRIEF DESCRIPTION OF THE DRAWINGS

FIG. 4A is a diagram for explaining a process that renders charge uniform;

FIG. 4B is a diagram for explaining the process that renders charge uniform;

FIG. 12A is a diagram for explaining second processing of rendering charge uniform;

FIG. 12B is a diagram for explaining the second processing of rendering charge uniform;

FIG. 20A is a diagram for explaining a GUI screen of charge processing;

DETAILED DESCRIPTION OF THE PREFERRED EMBODIMENTS

Figure 1:
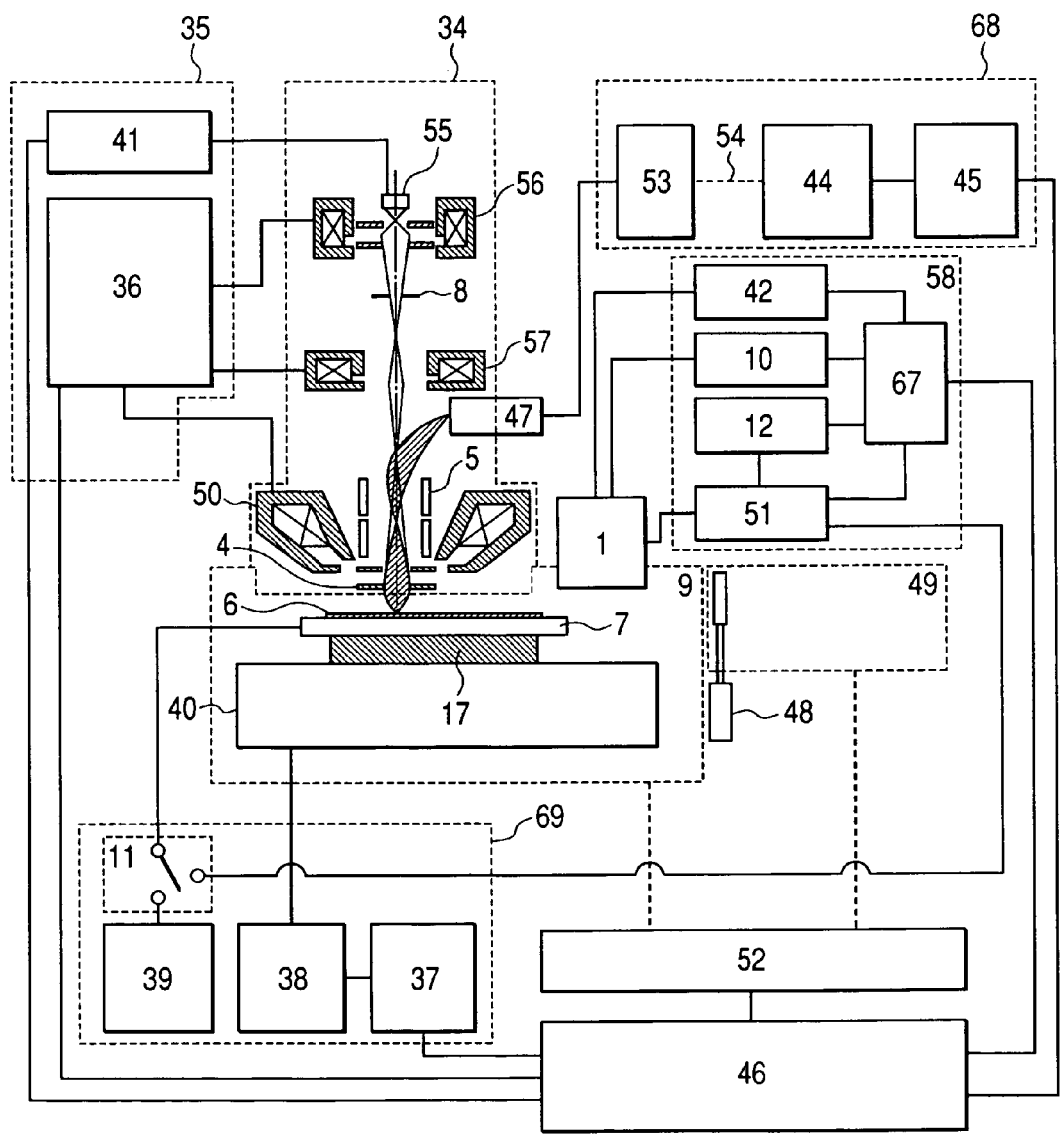
FIG. 1 is a block diagram of a semiconductor pattern inspection instrument equipped with a charge control apparatus of a first embodiment.

Hereafter, embodiments of this invention will be described in detail with reference to drawings.

First Embodiment

In this embodiment, an example of one configuration of an SEM type semiconductor inspection instrument to which charge processing technology is applied will be explained. The SEM type semiconductor inspection instrument explained in this embodiment has a configuration where a charged particle beam illumination system for charge control and an SEM column are arraigned in parallel to a specimen, having a feature that a charge control beam is irradiated perpendicularly on a semiconductor wafer that is an inspection target. Moreover, in this embodiment, especially an embodiment that uses a CNT cathode as a charged particle beam source for charge control will be explained.

For a charged particle beam source for charge control, an electron source capable of illuminating a large area with a large current and realizing stable emission is preferable. The CNT cathode can irradiate a large area at one time and operate without heating at a degree of vacuum of about $1\times10^{-4}$ [Pa], and consequently would not give contamination and damage to the specimen even if being placed immediately adjacent to the specimen. In these respects, the CNT cathode is suitable for a light source for charge control compared with the conventional electron sources.

However, when the CNT cathode is used as a charged particle beam source for charge control, it is considered that the CNT cathode comes with the following problems (1). It is susceptible to a damage by gas molecules and ions. (2) The device needs a contrivance whereby variation of emission would not affect charge.

Regarding the above-mentioned (1), there is a case where an electron source may be damaged by ions generated by collision of electrons emitted from the electron source against an inner wall of a chamber. Moreover, if the specimen is a semiconductor device, a liquid crystal device, or the like, there is an influence of gases emitted from the specimen etc. In such a state, the emission current has a propensity to be unstable, and hence in order to make the CNT cathode operate stably as an electron source for processing of charge control, a contrivance whereby a gas partial pressure around the electron source is maintained low, so that damage of the electron source is suppressed as less as possible is needed. Furthermore, in order to realize highly uniform charge processing, a contrivance whereby, even when variation of emission occurs, the variation would not exert an influence on charge is necessary; therefore, the above-mentioned means for rendering charge uniform needs to be provided.

In addition, in order to realize high-precision charge control, a mechanism whereby whether charge of the specimen surface has reached saturation is determined is necessary. Especially, when using the CNT cathode that is prone to produce variation of the emission current, it can be said that the mechanism is indispensable in order to avoid insufficient charge resulting from decrease of the emission current.

FIG. 1 shows the SEM type semiconductor pattern inspection instrument equipped with a charge control apparatus of this invention. Hereafter, a basic configuration of the SEM type semiconductor pattern inspection instrument of this embodiment will be described. The inspection instrument is roughly divided into: an SEM column 34, a charge control column 1, a specimen chamber 9, a specimen preparation chamber 49, an SEM controller 35, a charge control system 58, an inspection system control unit 46, a vacuum system 52, an image formation unit 68, and a stage control unit 69, all of which are main constituents. The SEM column 34, the charge control column 1, the specimen chamber 9, and the specimen preparation chamber 49 shall be evacuated by the vacuum system 52. As will be described later, the charge control column 1 of this embodiment is equipped with a function of observing an electrified state of a specimen. The reference numeral 48 denotes a gate valve that partitions the specimen chamber 9 on the instrument body side and the specimen preparation chamber 49.

(SEM Column)

The SEM column 34 consists of an illumination system for illuminating the primary electron beam on a specimen and a detection system, the SEM column 34 being constructed with an SE cathode 55, a condenser lens A 56, an aperture 8, a condenser lens B 57, a detector 47, a deflector 5, an objective lens 50, and an charge control electrode 4. The specimen chamber 9 consists of a stage 40, an insulator 17, and a wafer holder 7 on which a wafer 6 is placed, wherein the wafer holder 7 and the grounded stage 40 are electrically insulated by the insulator 17. The wafer holder 7 is capable of being applied a voltage from the outside, i.e., a retarding power supply 39. The stage 40 is capable of being driven in a plane perpendicular to a center axis of the SEM column 34. That is, designating the center axis of the SEM column as a z-axis, the stage 40 can move in an x-y plane. The wafer holder 7 is fixed to the stage 40 via an insulator 17, and can be moved by driving the stage 40. Movement of the stage 40 is controlled by a stage controller 37 in the stage control unit 69 and a stage drive portion 38. In this embodiment, the retarding power supply 39 is so constructed as to be included in the stage control unit 69. Moreover, the stage control unit 69 is equipped with a selector to switch 11, and when monitoring charge processing, the selector switch 11 is connected to charge monitor portion 51.

(SEM Controller)

The SEM controller 35 manages controls of the electron source and various lenses included in the SEM column 34, and consists of an SEM electron gun power supply 41 and a lens controller 36. The primary electrons emitted from the SE cathode 55 are adjusted so as to focus on the wafer 6 using the condenser lens A 56, the condenser lens B 57, and the objective lens 50. At this time, energy of the primary electron incident on the wafer is governed by a difference between a negative electrode voltage applied to the SE cathode 55 and a retarding voltage applied to the wafer 6. By altering the retarding voltage, energy of the primary electron incident on the wafer 6 can be altered. The secondary electrons generated by the wafer 6 are accelerated and drawn into the detector 47.

(Detection System and Image Formation Unit)

In order to form a scanning image, the primary electrons are deflected by the deflector 5 so that the primary electrons may scan the wafer 6, the secondary electrons grabbed by the detector 47 are converted into a digital signal by an AD converter 53, which sends the signal to optical fiber 54 and an image processing portion 44. Then in the image processing portion 44, a scanning image is formed as a map of the secondary electron signal in synchronization with the scanning signal. Here, the detector 47 and the AD converter 53 shall be in floating by a high voltage of a positive polarity. The image processing portion 44 compares images of the same pattern at different locations in the wafer 6 and extracts a defect part. Then, it stores coordinate data of the extracted defect and the image of the defect part as inspection results. The user can check these inspection results as in the form of a defect distribution in the wafer 6 and a defect image in an image display portion 45 at any time. In the semiconductor pattern inspection instrument shown here, in order for optimal inspection to be performed always, the inspection system control unit 46 stores a pattern of a wafer to be inspected, information of a process, inspection conditions, inspection areas, a threshold for defect detection, etc. and manages and controls the whole instrument collectively. By these operations, the semiconductor pattern inspection instrument is configured to inspect a wafer regardless of presence of the operator, and monitor failures of a semiconductor pattern.

(Charge Control Unit and Charge Control Column)

Figure 2:
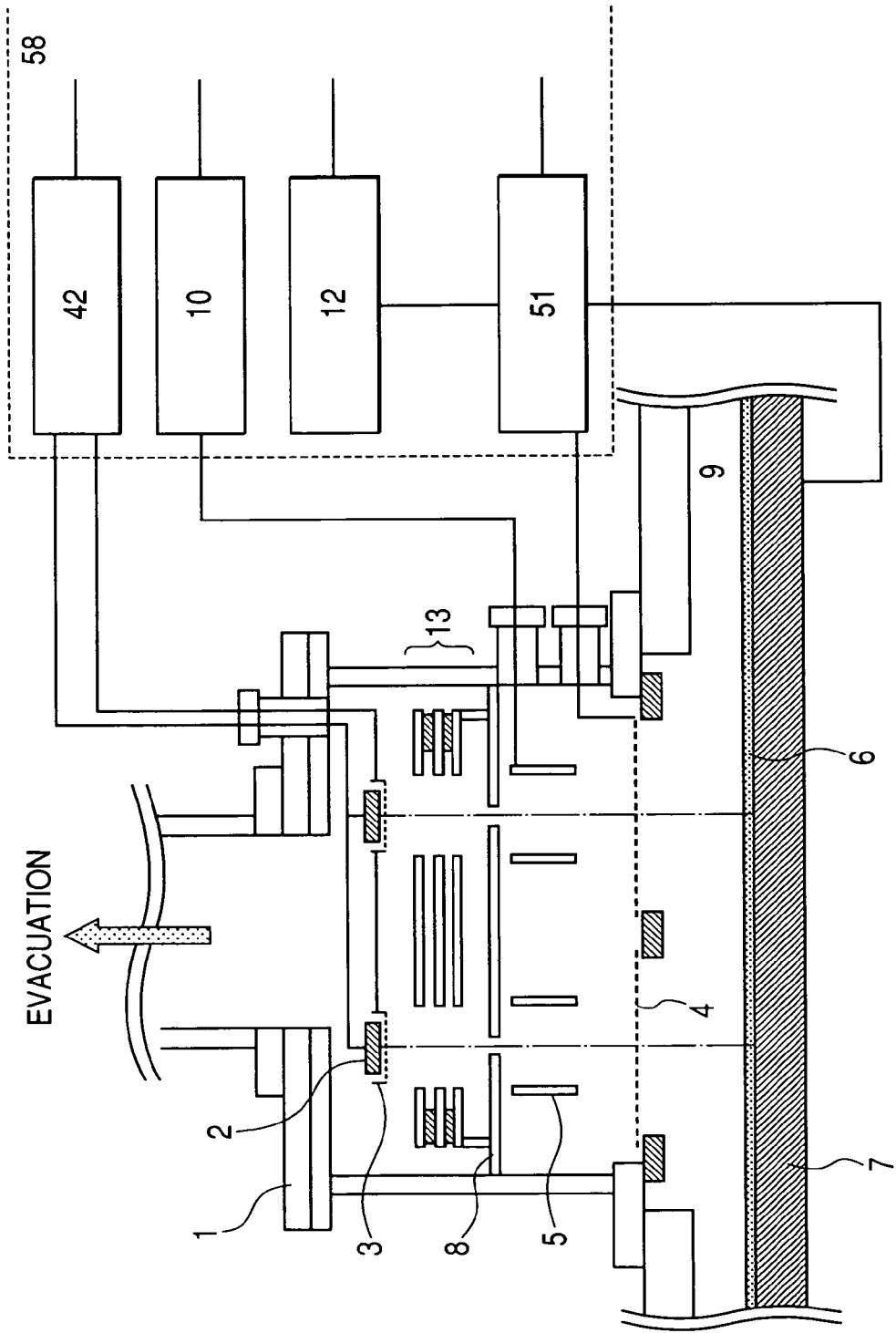
FIG. 2 is a schematic diagram of a charge control apparatus of the first embodiment.

Next, a method for controlling charge of the SEM type inspection instrument of this embodiment will be explained. The charge control apparatus of this embodiment consists of a charge control column 1 and a charge control system 58, and its operation is collectively managed and controlled by the inspection system control unit 46. The inspection system control unit 46 stores information of a voltage value of charge, a flow of charge processing, etc. for each wafer that is an inspection target. The charge control system 58 includes a charge control apparatus 67, a CNT electron gun power supply 42, a column controller 10, a control electrode power supply 12, and the charge monitor portion 51. The charge control apparatus 67 controls the CNT electron gun power supply 42, the column controller 10, the control electrode power supply 12, and the charge monitor portion 51, based on information of the voltage value of charge, the flow of charge processing, etc. sent from the inspection system control unit 46. FIG. 2 shows an enlarged diagram of the charge control column 1 and the charge control system 58 in FIG. 1. The charge control system 58 of this embodiment consists of the CNT electron gun power supply 42, the column controller 10, the control electrode power supply 12, and the charge monitor portion 51. Moreover, the charge control column 1 of this embodiment consists of the specimen chamber 9, a CNT cathode 2, an extraction electrode 3, an electrostatic lens 13, the aperture 8, the deflector 5, a charge control electrode 4, etc. all of which are arranged on the specimen chamber 9. The specimen chamber 9 and the charge control column 1 are evacuated to such a degree of vacuum that enables the CNT cathode 2 to emit electrons. Incidentally, although not shown in the figure, the charge control apparatus of this embodiment is also provided with wiring for supplying driving voltage to the electrostatic lens 13. The wiring passes through an opening provided in the aperture 8, is drawn around to the outside of the charge control column 1 through a feed through together with wiring to the deflector 5, and is connected with the column controller 10.

Here, in view of miniaturization of the instrument, only one evacuation apparatus for charge control instrument is provided. Then, a space where the specimen chamber 9 and the CNT cathode 2 are arranged is with a differential pumping structure so that the degree of vacuum at least around the CNT cathode 2 is maintained within a predetermined value. In order to realize the differential pumping structure, a port for evacuation is provided above the aperture 8. That is, the specimen chamber 9 is partitioned into a high vacuum region and a low vacuum region with the aperture 8 as boundary. Furthermore, in order to reduce an influence of gas molecule generated around the wafer 6 on the CNT cathode 2, the aperture 8 is provided only with an opening that allows an electron beam emitted from the CNT cathode to pass through and wiring coming from the electrostatic lens 13. Moreover, in order to equalize variation of emission of the electron source, the charge control apparatus of this embodiment is equipped with a plurality of CNT cathodes 2. However, in the case where the wafer holder 7 and the inspection specimen are small and hence it is not necessary to irradiate them with a plurality of CNT cathodes 2, and in the case where there is no need to increase the processing speed and hence the same position can be irradiated for a long enough time to disregard the variation of emission, the charge control apparatus may be constructed with only one CNT cathode.

The CNT electron gun power supply 42 is used to make the CNT cathode 2 emit electron, and the column controller 10 is used to control trajectories of electrons emitted from the CNT cathode 2 that will be described later. The control electrode power supply 12 is used to form an electric field of arbitrary strength including a zero electric field, between the charge control electrode 4 and the wafer 6, and the charge monitor portion 51 is equipped with a function of monitoring an absorption current flowing into the charge control electrode 4 and the wafer 6. Means for monitoring the absorption current will be described in detail in the latter part of this embodiment.

The specimen chamber 9 shall consist of the wafer holder 7 on which the wafer 6 is placed and held and these constituents shall be placed on a specimen stage not shown in the figure. The specimen stage moves two-dimensionally in a plane perpendicular to an incident direction of electrons that the charge control column 1 irradiates and shall be controlled to irradiate electrons over the whole surface of the wafer. Note that FIG. 2 shows examples of two kinds of means, that is, means for moving the stage to which the wafer is attached and means for deflecting the electron beam with the deflector 5, as means for relatively moving electrons illuminating the specimen with respect to the wafer. However, in order to realize this invention, at least one or more means for relatively moving electrons illuminating the specimen with respect to the specimen are sufficient. It is possible that only with movement of the stage, the effect of this invention can be demonstrated.

Although this embodiment explained the example that used the CNT cathode as an electron source for preliminary charge, existing electron sources can be used as long as they are electron sources capable of achieving stable characteristics. Further, if the electron source is less prone to damage by gas molecule, ions, etc., it is not necessary to construct the charge control apparatus to be with the differential pumping structure. On the other hand, a configuration consisting of a plurality of electron sources to suppress variation of emission is also effective to other electron sources besides the CNT cathode.

Figure 3:
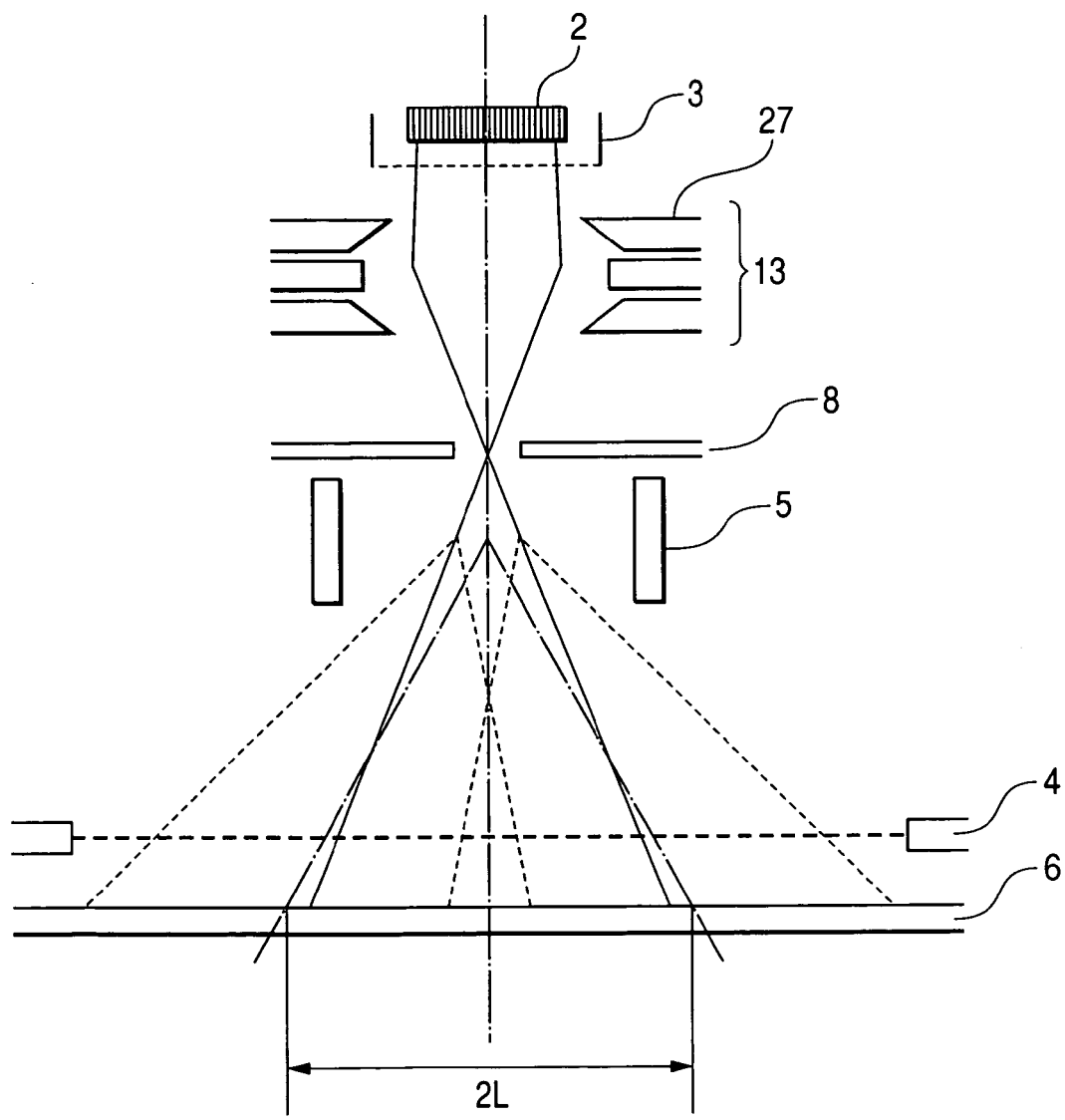
FIG. 3 is a diagram for explaining electron trajectories of the charge control apparatus.

FIG. 3 shows schematically a trajectory of the electron beam emitted from one of the CNT cathodes 2 in the charge control column 1 shown in FIG. 2. Electrons emitted from the CNT cathode 2 are accelerated by energy determined by the potential difference between an anode electrode 27 of the uppermost portion of the electrostatic lens 13 and the CNT cathode 2, and come into a focus almost at a position of the aperture 8 with the electrostatic lens 13. Then they are controlled to scan the wafer with the deflector 5 in a direction perpendicular to the moving direction of the wafer 6. Here, the aperture 8 is provided to prevent the specimen from being contaminated by foreign matters generated from the vicinity of the CNT cathode 2 and prevent the CNT cathode from being degraded by gases emitted from the wafer 6. The reason for focusing the electrons at the aperture 8 with the electrostatic lens 13 is to irradiate the specimen with as many electrons emitted from the CNT cathode 2 as possible. Moreover, although trajectories of electrons are different from those shown in FIG. 3, this aperture 8 may be used to limit the electrons emitted from the CNT cathode 2. It is also possible to adjust a current of the electron beam illuminating the specimen by altering convergence of the electrostatic lens 13 and thereby limiting the beam with the aperture 8. The energy of the electron incident on the wafer 6 is so determined that the number of the secondary electrons emitted from the specimen is larger than the number of the primary electrons incident on the specimen. The charge control of the wafer 6 is governed by a potential difference between the charge control electrode 4 disposed right above the wafer 6 and the wafer 6: when with a positive bias (potential of charge control electrode 4>potential of wafer 6), the wafer 6 surface is electrified positively; and when with a negative bias (potential of charge control electrode 4<potential of wafer 6), the wafer 6 surface is electrified negatively. Moreover, it is also possible to adjust charge of the wafer 6 surface to almost 0 V by, setting the wafer 6 and the charge control electrode 4 to have the same potential.

FIG. 4 shows an example of stage movement in the case of controlling charge of the whole surface of the wafer 6 using the charge control column 1 equipped with eight CNT cathodes a-h. FIG. 4A shows a process in which charge control is conducted by moving the stage in the X-direction while illuminating electrons on the wafer 6, and FIG. 4B shows a process in which charge control is conducted by moving the stage in a Y-direction. The CNT cathodes 2 shown in FIGS. 4A and 4B shall be arranged in such a way that two CNT cathodes 2 are placed in the same direction as the stage movement and an electron beam is scanned by the deflector 5 disposed in the charge control column 1 with a width 2L. In FIG. 4A and FIG. 4B, the CNT cathodes a, b, e, and f and the CNT cathodes c, d, g, and h are arranged at vertexes of two squares each with a side length 2L, and the sides of each square are almost parallel to the stage moving direction. The CNT cathodes a, b, e, and f and the CNT cathodes c, d, g, and h are arranged with a phase shift equal to L in the X-direction of the stage and equal to L in the Y-direction thereof. Here, scanning speed of an electron beam shall be sufficiently faster than the moving speed of the stage. For example, when the stage moves in the X-direction (FIG. 4A), the CNT cathodes c and g irradiate the illumination area A, and the CNT cathodes a and e irradiate the area B. Here, in the area where the area A and the area B overlap, charge control will be conducted by electrons emitted from four CNT cathodes c, g, a, and e. When the stage moves in the Y-direction (FIG. 4B), the CNT cathodes a and b irradiate the area A, and the CNT cathodes c and d irradiate the area B. Moreover, in the embodiment shown in FIGS. 4A and 4B, charge control is conducted in the same area on the wafer 6 with four CNT cathodes, and accordingly nonuniformity of charge of the wafer 6 resulting from individual differences of the CNT cathodes and variation in current density among them can be suppressed to a minimum. Therefore, as in the embodiment, by controlling deflection of the electron beam and movement of the stage according to an arrangement of a plurality of CNT cathodes, ununiformity of charge can be reduced. Note that, in this embodiment, deflection of the electron beam and movement of the stage are so controlled that the width of scanning of elections becomes equal to a distance between adjacent electron sources. However, if the control is so conducted that [the width of scanning]≧[distance between adjacent electron sources], the effect of this embodiment can be achieved without any problem. These controls are realized by cooperation of the SEM controller 35, the stage control unit 69, and the inspection system control unit 46.

Figure 5:
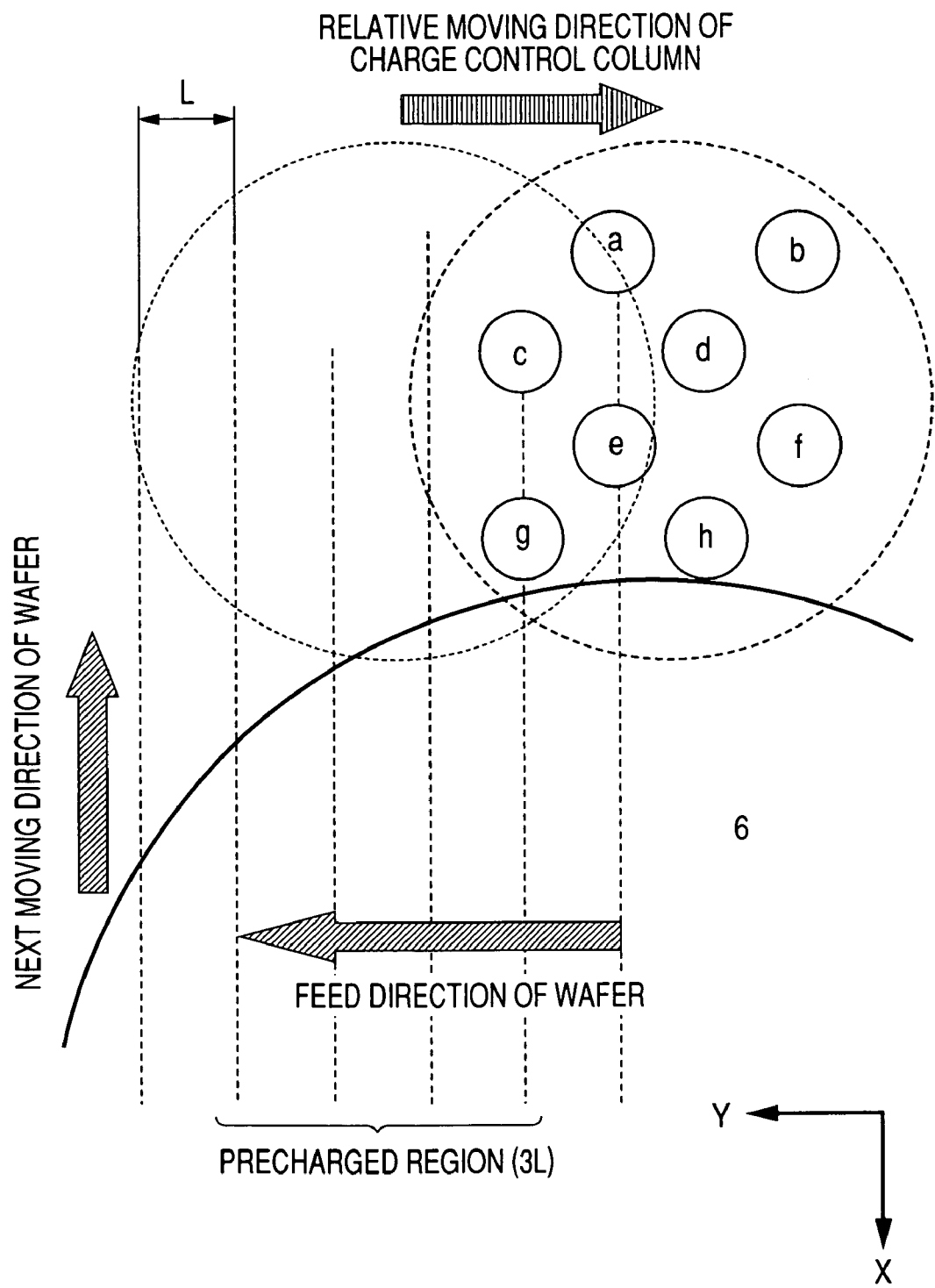
FIG. 5 is a diagram for explaining a process that renders charge uniform.

FIG. 5 shows a process of sending a stage to an area that will be subjected to charge control from now on after the process of FIG. 3A, the wafer 6 being sent to the Y-direction by the amount 3 L. Then, by the movement of the stage to the negative X-direction, the next area will be subjected to charge control.

(Method and Means for Monitoring Electrified State)

So far, the instrument configuration and the method for rendering charge in the specimen surface uniform by illuminating an electron beam on the specimen uniformly were explained. However, in order to control charge to a high degree, it is necessary to monitor the specimen surface to find whether charge thereof has reached saturation by electrons for illumination. In this embodiment, the electrified state is monitored by observing temporal variation in the amount of current observed with the charge control electrode 4 and temporal variation of the current flowing into the wafer 6.

The amount of current observed with the charge control electrode 4 is defined by the sum of a current flowing in the charge control electrode 4 when electrons emitted from the electron source 2 irradiate the wafer 6 and a current flowing into the charge control electrode 4 among the secondary electrons emitted from the wafer 6. If the amount of electrons emitted from the electron source is constant, the amount of current is governed only by the amount of the secondary electrons flowing into the charge control electrode 4. The monitoring function of charge can be realized by monitoring of this amount of the secondary electrons. On the other hand, since the absorption current flowing into the wafer 6 depends on a leakage current flowing into the substrate from the insulator constituting the surface of the wafer 6. When charge of the insulator of the wafer surface has reached saturation, its temporal variation becomes almost zero, and consequently charge function can be realized by monitoring the absorption current. The two kinds of methods have respective merits. When the wafer 6 is electrically insulated to the wafer holder 7, the absorption current does not flow into the wafer holder 7 from the wafer 6, and accordingly the electrified state cannot be known by monitoring the absorption current. However, in the case of monitoring the current flowing into the charge control electrode 4, the secondary electrons emitted from the wafer 6 are monitored; therefore, the monitoring is possible even when the wafer 6 is electrically insulated from the wafer holder 7. On the other hand, in the case where the surface of the wafer 6 is composed of a material having low secondary electron emission efficiency, almost no secondary electrons are detected with the charge control electrode 4, and accordingly is not suited to monitor charge. However, in the case of monitoring the absorption current flowing into the wafer 6, monitoring is possible provided that the wafer 6 and the wafer holder 7 contact electrically; therefore, it is effective in monitoring the charge. (In this embodiment, a configuration that uses the above-mentioned two kinds of charge monitor methods together is described. However, monitoring of charge is possible with either of the two methods.) Hereafter, one example of a configuration of monitoring the charge of a specimen by absorption current measurement will be shown.

Figure 6A:
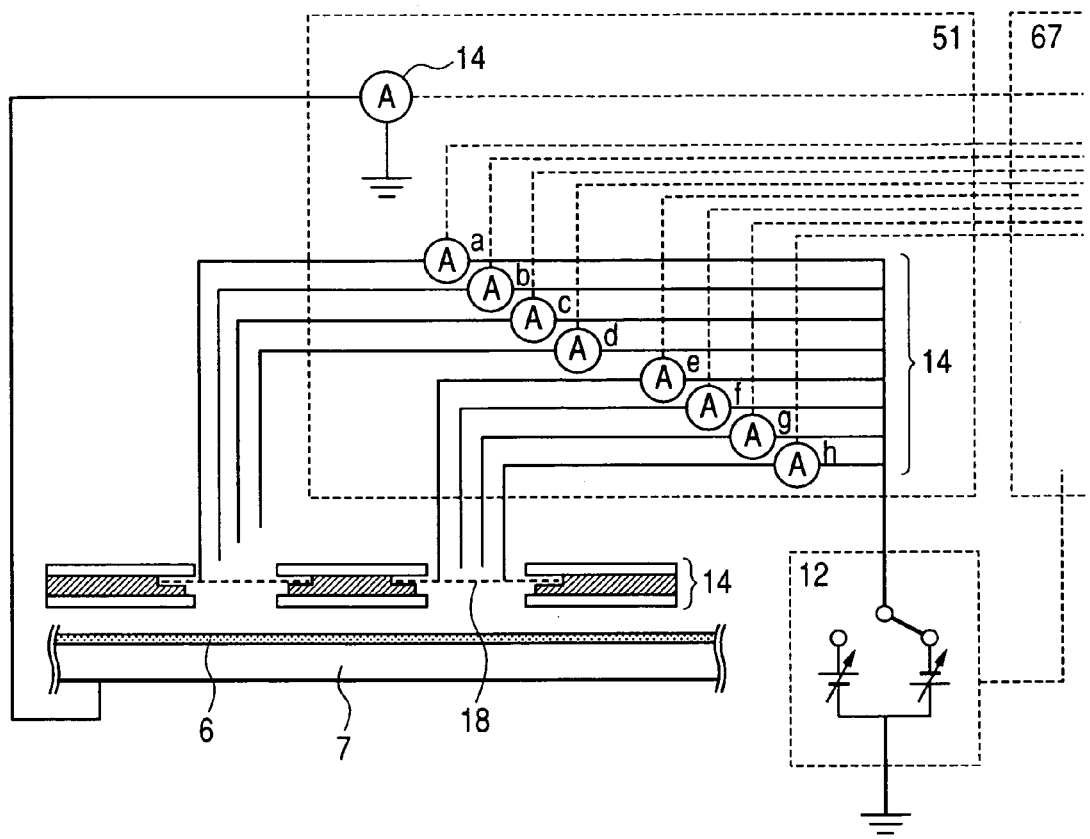
FIG. 6A is a block diagram for realizing a charge monitor.

FIG. 6A is an enlarged diagram of a portion of the charge control electrode 4 of the charge control apparatus shown in FIG. 2—showing only the charge control electrode 4, the charge monitor portion 51, the wafer 6, and the wafer holder 7 in the figure. The ampere meter 14 is connected with the wafer holder 7 so that a current flowing into the wafer 6 can be monitored. Each of the charge control electrodes 4 is connected with an ampere meter 14 that is put in a floating state by the control electrode power supply 12 capable of setting its polarity to either positive polarity or negative polarity, so that a current flowing into the mesh in the charge control electrode 4 can be monitored. Note that in the above explanation, the charge control electrode 4 means an electrode for charge control provided in the charge control column 1, but it is also possible to realize an charge monitor function by providing a similar electrode for charge control in the SEM column 34. In the case where an charge monitor function is implemented in the SEM column 34, an ampere meter having almost an equivalent structure to a structure shown in FIG. 6A is provided between the charge control electrode 4 shown in FIG. 1 and the inspection system control unit 46, and a calculation in which measured values of the ampere meters are collected in the inspection system control unit 46 and a potential value of the specimen surface is derived is carried out.

Figure 6B:
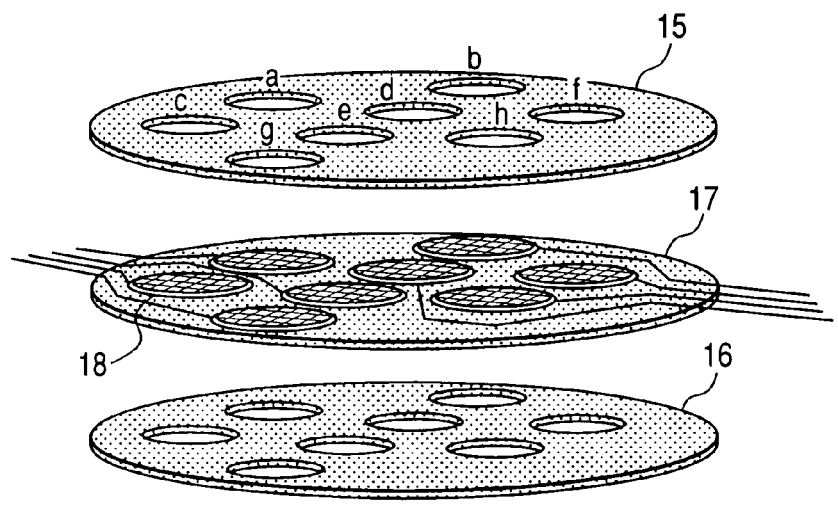
FIG. 6B is a block diagram for realizing a charge monitor.

Next, a structure of the charge control electrode 4 will be explained. FIG. 6B shows a structure of the charge control electrode 4 in detail, having a three-layered structure of the electrode A 15, the insulator 17, and the electrode B 16. Holes each of which allows the electrons emitted from the CNT cathode 2 to pass through are provided in the electrode A 15, the electrode B 16, and the insulator 17, respectively, according to the number of the CNT cathodes 2, all electrodes being grounded.

A metal grid 18 is spanned over each hole provided in the insulator 17 and the each grid 18 is electrically insulated so that a current flowing into the grid 18 can be monitored individually.

Moreover, wiring that connects the each grid 18 and the charge monitor portion 51 is formed on the surface of the insulator 17. The wiring passes through a feed-through provided in the charge control column 1 and is drawn around to the outside of the specimen chamber 9. Incidentally, in the example of the configuration shown in FIG. 6A, the absorption current is measured with the ampere meters whose number accords with the number of a plurality of CNT cathodes a to h, but the measurement may be done with a signal ampere meter as long as the absorption current measured by the each grid 18 can be identified. Incidentally, although the electrode can be formed only with the insulator 17 and the grid 18, the electrode was formed to have the above-mentioned three-layered structure. Since the electron beam does not collide against the insulator 17 directly, there can be obtained an effect that a shift of the electron trajectory resulting from charge-up of the insulator 17 and unevenness of charge potential of the wafer do not occur.

Figure 7A:
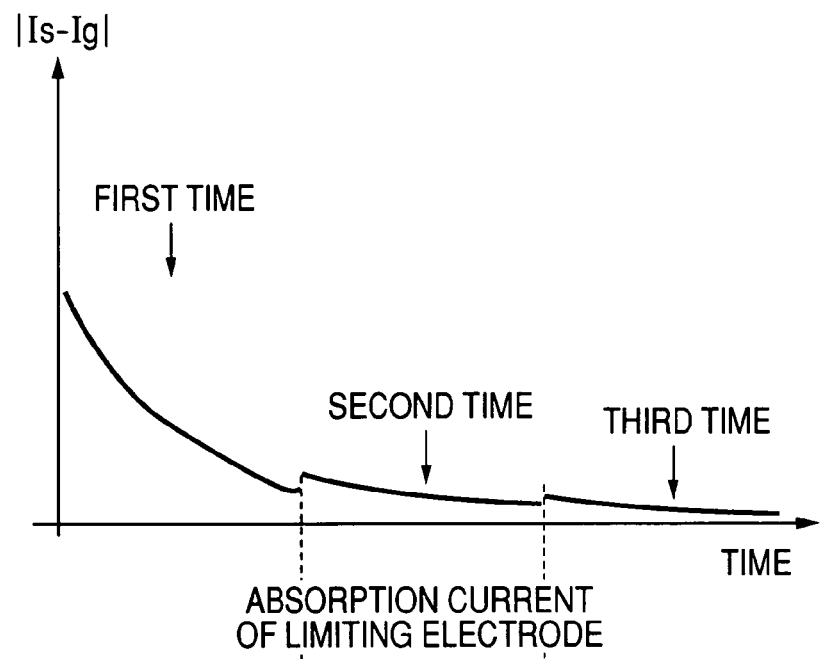
FIG. 7A is a graph of an example of a charge monitor by an absorption current.

FIG. 7A shows one example of results obtained by illuminating electrons on the specimen and monitoring a current flowing into the charge control electrode 4. The horizontal axis represents an elapsed time from the start of illumination of electrons, and the vertical axis represents an absolute value of a difference of the absorption currents flowing into a C-th mesh and into a G-th mesh. In an example shown in FIG. 7A, a moving direction of the wafer 6 shall be the X-direction, as shown in FIG. 4A. When moving in the X-direction, the wafer 6 is irradiated by electrons emitted from the CNT cathodes 2c, and subsequently the same area is irradiated with the CNT cathodes 2g. When moving in the negative X-direction, the illumination is performed in an opposite manner. That is, charge of the wafer will be monitored by monitoring a difference of currents flowing into respective meshes arranged in almost the same directions as the moving direction of the stage.

FIG. 7A shows a case where the whole surface of the wafer 6 is irradiated three times by an operation shown in FIG. 4. When the number of times of illumination increases, a difference between a current flowing into the C-th mesh and a current flowing into the G-th mesh becomes smaller. Whether charge on the wafer 6 surface has reached saturation is determined by checking both whether the difference of currents is approximately zero, and whether there is no temporal variation. Here, since a criterion of determination may change with wafers that are targets of processing, the user shall have the freedom to determine allowable values of determination. In the example shown in FIG. 7A, it is determined that the charge has reached saturation by facts that a difference between a current value at the time of starting the measurement of the absorption current (Ic−Ig) and a current at the time of ending the measurement is equal to or more than a predetermined threshold and that a difference between an absorption current at the time of starting the n-th measurement and an absorption current at the time of starting the (n+1)-th measurement becomes equal to or less than a predetermined threshold. In FIG. 7A, at the third operation, it was determined that the charge had reached saturation.

In the explanation above, although an absolute value of Ic−Ig was used as a typical value of the absorption current for convenience, in order to determine whether charge of the whole wafer surface has reached saturation, it is necessary to monitor a difference of the absorption current for all meshes a-h in principle. For example, for the mesh a, absorption current measurement is done for all combinations of a-b, a-c, . . . a-g, and for the mesh b, absorption current measurement is done for all combinations of b-a, b-c, . . . b-g. Thus, the absorption current measurement is done for all the combinations. When the charge has reached saturation for all the combinations, it is determined that the whole surface of the wafer has electrified uniformly. The inspection system control unit 46 of FIG. 1 is equipped with memory for storing control software for determining charge saturation and a processor for executing the software, and determines charge saturation based on a measured current at each mesh being transmitted from the charge monitor portion 51.

For practical purposes, it is not necessary to conduct absorption current measurement for all the combination of meshes, it is often sufficient to conduct the absorption current measurement only for adjacent meshes. This is because if the current flowing from a most adjacent mesh is equal to or less than a predetermined value, it is very likely that a current flowing from a mesh farther than this is equal to or less than a predetermined value. Specifically, it is often sufficient to measure a difference of the amount of current between the mesh a and the most adjacent meshes c and d. By installing software having an algorithm of determining charge saturation in the inspection system control unit 46, it is possible to reduce a time required for preliminary charge.

When an charge potential of the specimen obtained by monitoring is fed back to the control of the SEM column 34, measured value information of the measured potential is transmitted to the inspection system control unit 46 through the charge control apparatus 67. Based on the potential measured value being transferred, the inspection system control unit 46 calculates a drive voltage of the electron source and set values of various lenses, the deflector, etc. and transfers the control target values being calculated to the electron source power supply 41, the lens controller 36, or the retarding power supply 39. The control units to which control target values were transmitted, respectively, control respective constituents of the SEM column based on the target values.

Incidentally, when potential measurement results are fed back to an operation of the charge control system 58, the inspection system control unit 46 calculates the control target values of the CNT electron gun power supply 42 and the column controller 10, and transfers them to respective control units.

Figure 7B:
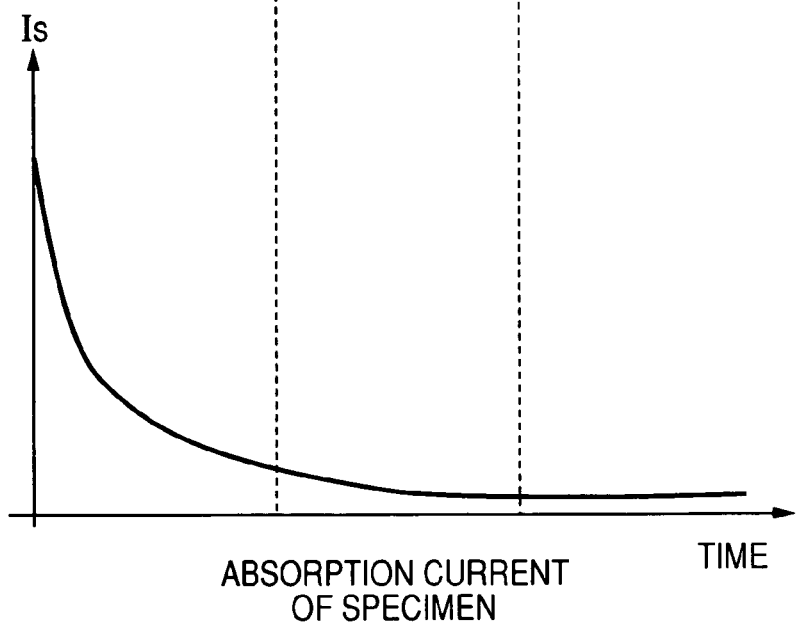
FIG. 7B is a graph of the example of a charge monitor by the absorption current.

FIG. 7B is a diagram where the absorption current flowing into the wafer 6, not in the charge control electrode 4, is monitored as a function of time. In FIG. 7B, the horizontal axis represents an elapsed time from the start of illumination of electron, and the vertical axis represents the absorption current flowing into the specimen. This case, like FIG. 7A, also shows a result obtained by repeating a process of illuminating electrons over the whole surface of the wafer 6 by the operation of FIG. 4A three times. It is found that with increasing number of illumination, temporal variation of the absorption current tends to diminish. A mechanism by which the temporal variation of the absorption current diminishes is that a potential difference between the control electrode 4 disposed right above the specimen and the specimen becomes almost zero, and the number of primary electrons 23 incident on the specimen and the number of secondary electrons 24 emitted from the specimen become in steady states, respectively. These states indicate saturation of charge.

Figure 8B:
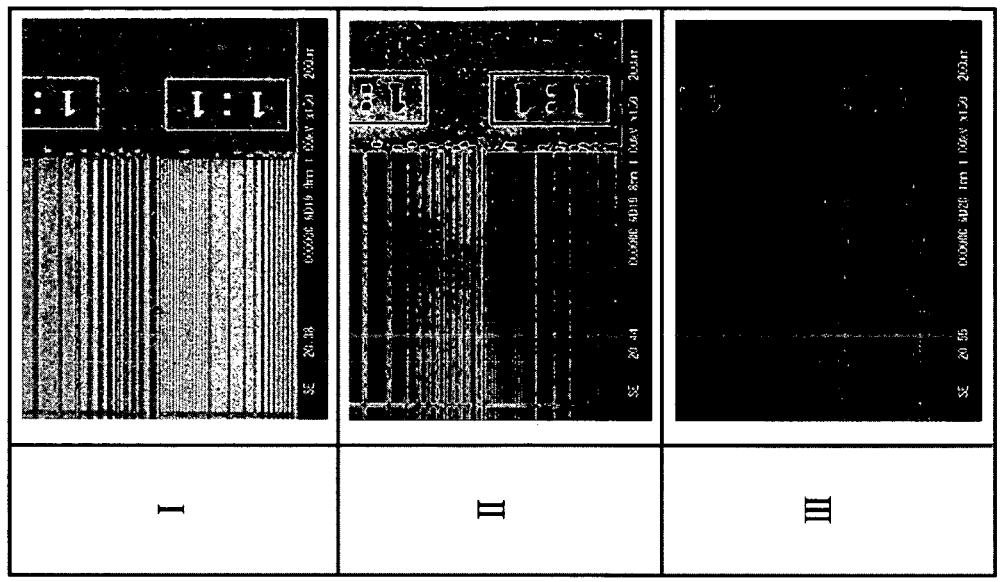
FIG. 8B is a graph of the example where charge control processing is conducted according to this invention.
Figure 8A:
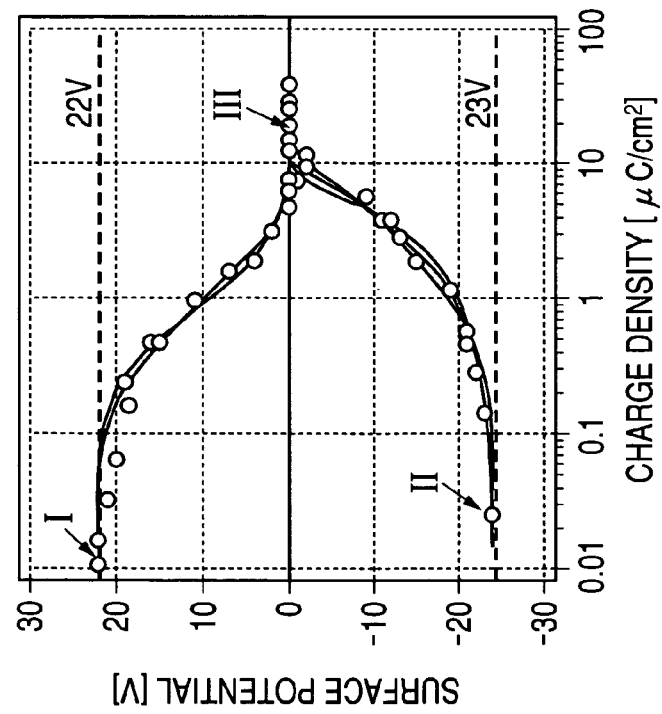
FIG. 8A is photographs of an example where charge control processing is conducted according to this invention.

In FIG. 8, a result obtained by conducting charge control by the charge control apparatus of this invention will be explained. FIG. 8A shows a relation of the surface potential [V] versus the charge density [$\mu C/cm^2$] of the electron beam that irradiated the specimen. This is a result obtained by setting a potential difference between the charge control electrode 4 right above the specimen and the specimen to 0 V, starting from an electrified state of the specimen, and performing charge processing so that the specimen surface may become approximately 0V. The specimen used was a Si wafer with a thin film of SiN deposited thereon, a pattern of line and space being formed on the thin film by etching. A voltage of SiN of the specimen surface becomes approximately 0 V (State III) by charge processing with an electron illumination density of 5 [$\mu C/cm^2$] or more from an electrified state I of SiN of the specimen surface having approximately 22 V. Moreover, a voltage of SiN of the specimen surface becomes approximately 0 V (State III) by charge processing with an electron illumination density of 10 [$\mu C/cm^2$] or more from an electrified state II of SiN of the specimen surface having approximately −23 V.

FIG. 8B shows photographs of State I, II, and III of FIG. 8A, respectively, each observed by SEM (Scanning Electron Microscopy) with incident energy of 1 keV and a probe current of 50 pA. In State I where SiN is electrified positively, a line part where SiN was etched and the Si substrate was exposed was able to be identified as having bright contrast. Moreover, in State II where SiN is electrified negatively, the line part was able to be identified as having dark contrast. Furthermore, in State III where SiN is at approximately 0 V, the contrast between the SiN part and the exposed Si-substrate part becomes the lowest. In FIG. 8, the case where the insulation film is made to be at 0 V from a state where the insulation film on the specimen surface is electrified is shown. It was also able to be checked that, as with this case, the case where the insulation film is electrified to an arbitrary potential from a state of the insulation film at 0 V was also controllable. Moreover, Si substrate on which $SiO_2$ and a resist are coated other than the SiN film gave the same result, and it was checked that charge control of this invention was effective.

Here, superiority of this embodiment to the conventional method for monitoring charge will be explained. Conventionally, the surface electrometer has been used as observation means of an electrified state. However, the surface electrometer cannot be disposed at the same location as where charge processing is performed from restrictions of an instrument size. Moreover, since the surface electrometer causes a stylus for measurement to approach the specimen surface to measure the surface potential, an external electric field cannot be applied to the specimen during potential measurement. Therefore, with the surface electrometer, potential measurement cannot be conducted simultaneously while performing charge processing, and thus real-time charge monitor cannot be conducted in performing charge processing. From this fact, when monitoring charge using a surface electrometer, in order to find whether desired charge is formed by charge processing, it is necessary to repeat the charge processing by an electron beam and the charge measurement by a surface electrometer by turns and determine it. Therefore, it is unsatisfactory to apply a system using the surface electrometer to a semiconductor measurement apparatus for which high-precision and high-speed charge control is required, i.e., exact determination as to whether charge processing is completed cannot be made.

In the foregoing, a technique of monitoring the charge potential of a specimen using the charge control electrode provided to the charge control column and the SEM column was explained. The method for observing an electrified state using the charge control electrode of the charge control column is suitable for, especially, a case where an charge profile over the whole specimen is measured processing; the method for measuring an electrified state using the charge control electrode of the SEM column is suitable for a case where a local charge potential of a specimen is observed.

Note that, although this embodiment showed the controller and method for controlling the charge using a semiconductor pattern inspection instrument for an example, the controller of charge and the method for controlling charge of this invention can be applied to pattern dimension measurement of a semiconductor and charge removing processing in a semiconductor manufacture process, a specimen that is an object of processing is not limited to semiconductor devices, and any specimen that has an insulating film in an area on the specimen that is irradiated by an electron beam can be a target of application.

As described in the foregoing, with the instrument explained in this embodiment, an electron beam application instrument equipped with means for controlling charge suited especially to an inspection instrument of a semiconductor specimen is realized.

Second Embodiment

In the electron beam application device shown in the first embodiment, charge on the specimen surface is controlled using the charge control column provided adjacent to the SEM column, uses both scanning of electrons and movement of the stage together, and renders charge uniform. In the second embodiment, the electron beam application instrument equipped with an charge control function in the specimen reparatory chamber was explained. Moreover, the charge control apparatus of this embodiment is different from the charge control apparatus explained in the first embodiment in that its operating principle is not charge control by the charge control electrode, charge on the specimen surface is controlled with incident energy of the primary electron beam that irradiates a specimen, and the charge control apparatus is relatively moved to the specimen to render charge uniform.

Figure 9:
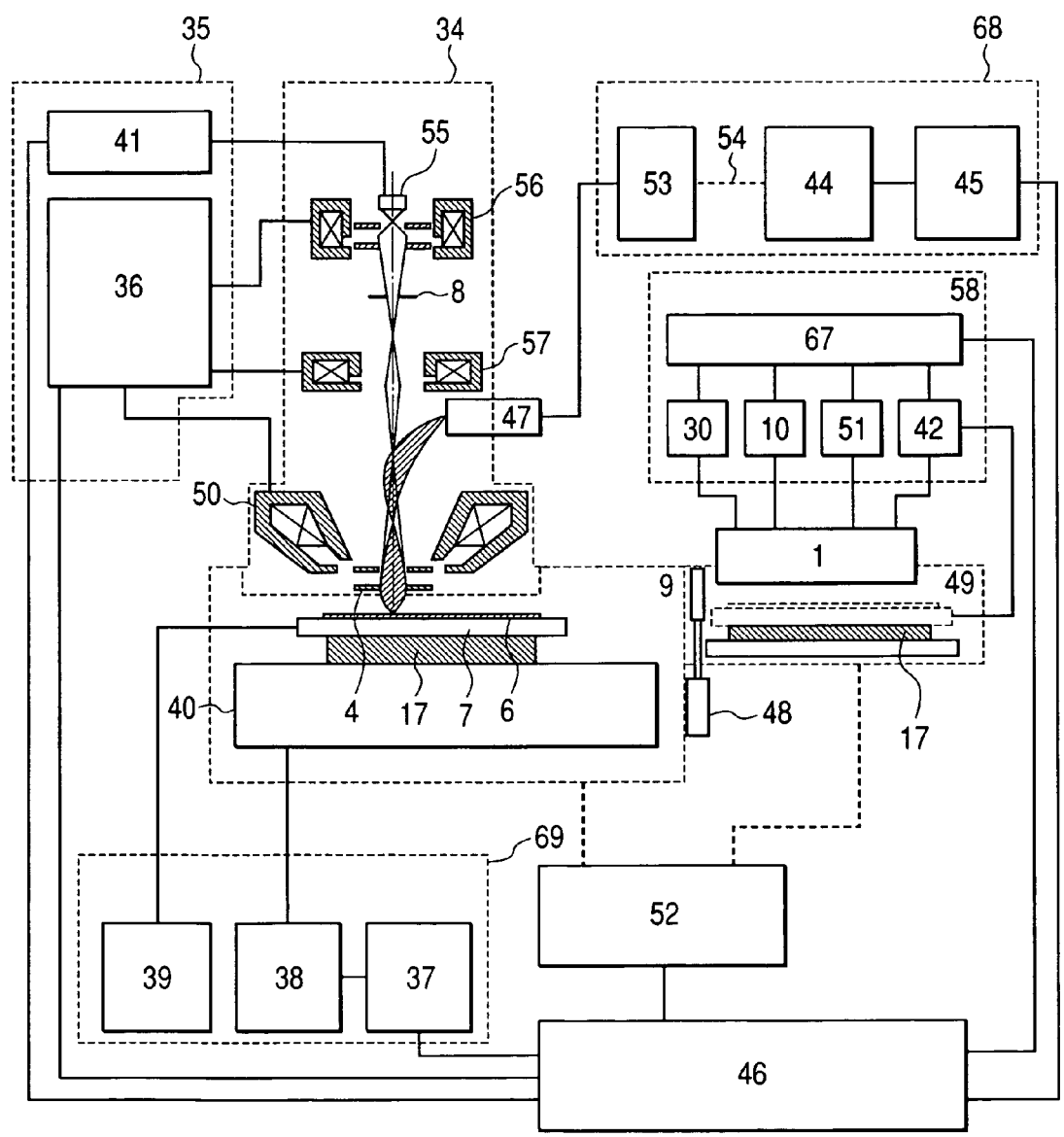
FIG. 9 shows a configuration of a semiconductor pattern inspection instrument equipped with a second charge control apparatus of a second embodiment.

FIG. 9 shows an example of a semiconductor pattern inspection instrument with which the above-mentioned charge control apparatus is incorporated, wherein the charge control column 1 is mounted above the specimen preparation chamber 49. Therefore, in the semiconductor pattern inspection instrument of this embodiment, charge control processing is conducted in the specimen preparation chamber 49, subsequently the gate valve 48 is opened to allow the specimen to be conveyed to the specimen chamber, and inspection performed according to a procedure. Moreover, the charge control system 58 shall consist of the column controller 10, the electron gun power supply 42, the charge monitor portion 51, and a column driving power supply 30 that is a power supply for driving a toolslide 26, and their operations shall be managed and controlled by the inspection system control unit 46 collectively.

Figure 10:
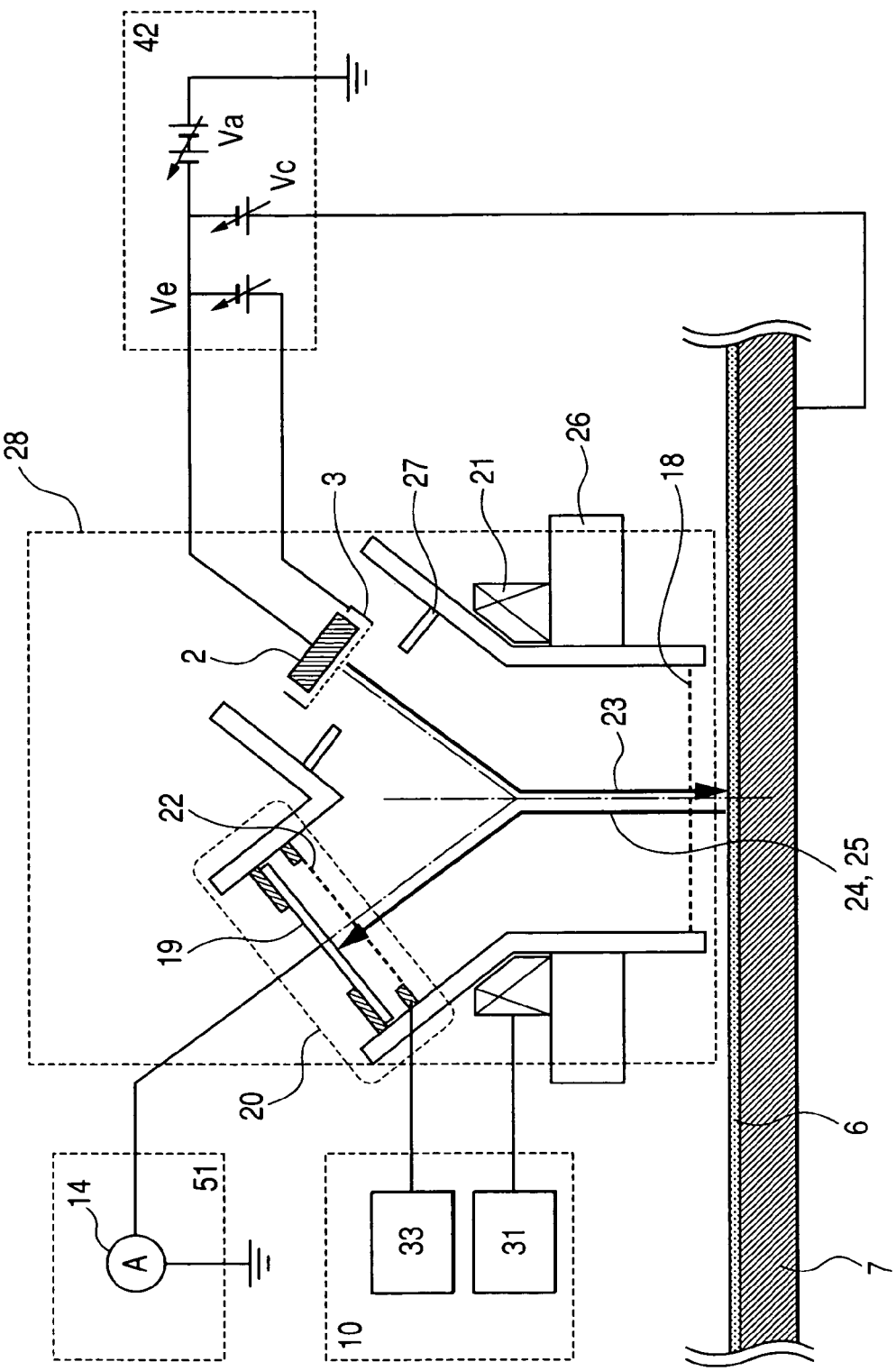
FIG. 10 is a diagram for explaining a second charge control unit.

FIG. 10 is a cross-section of the charge control unit that is provided in the charge control column 1 of FIG. 9. An internal structure of the charge control column 1 will be described later using FIG. 11. The charge control column 1 has a structure equipped with a plurality of charge control units 28 of FIG. 10 in it. The charge control column 1 is constructed with the charge control unit 28, the stage 26 that move the charge control unit 28 substantially in parallel to the wafer 6 or rotate it, the wafer 6, and the wafer holder 7. These constituents shall be arranged in the vacuum chamber that can maintain the degree of vacuum to such a degree that the electron source 2 can emit electrons (In FIG. 9, the specimen preparation chamber 49). Moreover, the wafer 6 and the wafer holder 7 are electrically insulated with the insulator 17 shown in FIG. 9, which makes it possible to apply voltages to them. Here, the charge control apparatus 28 consists of an electron source 2, an anode electrode 27, an ExB deflector 21, the grid A 18, a grid B 22, and a metal plate 19, wherein the charge control unit 28 shall be attached on the toolslide 26 that can move substantially in parallel to the wafer 6 or rotate. Although this embodiment uses the grid A 18, the grid A is not necessarily a grid as long as it can form a substantially parallel electric field between itself and the wafer, and for example, may use a conducting flat plate.

In order to equalize variation of emission, the electron source 2 is made up of a plurality of electron emission elements. The electron source 2 is connected with the electron gun power supply 42. The electron gun power supply 42 of this embodiment has three power supplies. One of them is a variable power supply Va serving as a drive power supply for the electron source 2, and one end thereof is grounded. Another one is a variable power supply Vc for supplying a predetermined potential difference between the wafer holder and the grounded potential, and thereby supplies the potential Va+Vc to the wafer 6. The last one is a variable power supply Ve, which is used to create the potential difference Ve between the electron source 2 and the extraction electrode 3 and extract electrons from the electron source 2. The electron gun power supply 42 is further connected with the inspection system control unit 46, and set values of power supplies provided in the electron gun power supply 42 are supplied from the inspection system control unit 46.

The electrons emitted from the electron source 2 travel with energy (E_Va) corresponding to the voltage (Va) applied to the electron source 2, and are bent toward the wafer 6 by the ExB deflector 21. The voltage Va+Vc is applied to the wafer 6 to form a deceleration electric field between the grid A 18 disposed right above the wafer 6 and the wafer 6. That is, the primary electrons 23 of energy (E_Va) are slowed down by this electric field, and, in the case of the wafer 6 not being electrified, are slowed down to energy (E_Vc) and be incident on the wafer 6. Then, the secondary electrons 24 generated by the wafer 6 are accelerated to approximately (E_Va+Vc), and deflected to a direction opposite to the electron source 2 by the ExB deflector 21 so as to be incident on the metal plate 19 insulated from the earth. Here, a grid to which a voltage slightly negative to the earth can be applied is disposed immediately before the metal plate 19, and a combination of the grid B 22 and the metal plate 19 can play the role of a faraday cup. Hereinafter, in this embodiment, a part playing the role of the faraday cup (a part surrounded by dotted line including the metal plate 19 and the mesh 22) is called a faraday cup unit 20.

One of features of the charge control apparatus described in this embodiment is that charge of the wafer 6 is controlled by controlling the voltage Vc applied to the wafer 6, and Vc must be positive. Moreover, when the initial potential of the wafer 6 surface is 0 V, incident energy of the primary electrons 23 corresponds to Vc, and consequently Vc must be determined so as to make emission number of the secondary electrons from the wafer 6 smaller than incidental number of the primary electrons 23. When satisfying these conditions, the wafer 6 surface is electrified to −Vc, whereby charge has reached saturation. For example, when the potential of the electron source 2 is −1 kV and Vc=+10 V, the electrons emitted from the electron source are accelerated to 1 keV substantially at a position of the anode electrode 27. The electrons bent with the ExB deflector 21 are slowed down by an electric field formed between the grid A 18 disposed right above the wafer 6 and the wafer 6, and are incident on the wafer 6 with energy of 10 eV. Then, when the wafer surface is electrified in −10 V, the primary electrons 23 can no longer be incident on the wafer 6 and are all backscattered to become backscattered electrons 25 and are incident on the faraday cup unit 20 described previously. The faraday cup unit 20 is connected with the charge monitor portion 51, and, although not shown in the figure, the charge monitor portion 51 is further connected with the inspection system control unit 46. The charge monitor portion 51 is equipped with an ampere meter, and monitors charge by detecting a current generated in the faraday cup unit 20 with that ampere meter. In this charge control apparatus, when the wafer 6 is electrified to a potential corresponding to incident energy of the primary electron 23, charge has reached saturation, and at this time, Almost all the primary electrons 23 incident thereon are backscattered and detected by the faraday cup unit 20. Whether this charge has reached saturation is determined by a criterion that temporal variation of a current detected by the faraday cup unit 20 is approximately zero or a criterion that a detected current is maximum. When monitoring temporal variation of the current, at the time of forming a recipe the user sets an allowable amount for current variation in a procedure shown in a fifth embodiment that will be described later (embodiment of GUI) and the inspection system unit 46 determines whether the monitored value is within the allowable value. Moreover, when monitoring the amount of current, it is necessary to measure a maximum value of the amount of current that is detected by the faraday cup unit 20 first. This measurement is done under the condition that Vc is approximately 0 V, i.e., electrons incident on the wafer 6 are all backscattered. For a definition of this maximum, the amount of current detected by the faraday cup unit 20 may be stored in the inspection system unit 46, or a ratio of all the current emitted from the electron source 2 to a current detected in the faraday cup unit 20 may be stored. Moreover, the allowable amount to the maximum that was stored may be determined in the same procedure as that in the fifth embodiment (embodiment of GUI).

The charge control unit 28 shown in this embodiment is a case for charging negatively the wafer 6 surface from 0 V, and cannot charge it positively in principle. However, since in the charge control instrument of this embodiment, almost all the electrons being irradiated contribute to charge, it can be said that the embodiment is an extremely simple method for charging a positively electrified specimen to 0 V or −few tens of volts. Moreover, it can also be said a large advantage that a specimen can be electrified to a set potential with precision of 1 to 2 V only with a configuration shown in this embodiment. Controlling charge of the wafer 6 surface so as to have either positive polarity or negative polarity with the configuration of this embodiment can be realized by using the grid A 18 disposed right above the wafer 6 as an charge control electrode by electrically insulating it from the earth and determining incident energy of the primary electron 23 incident on the wafer 6 so that the number of the secondary electrons emitted from the wafer 6 are larger than that of the incident primary electrons 23.

Figure 11:
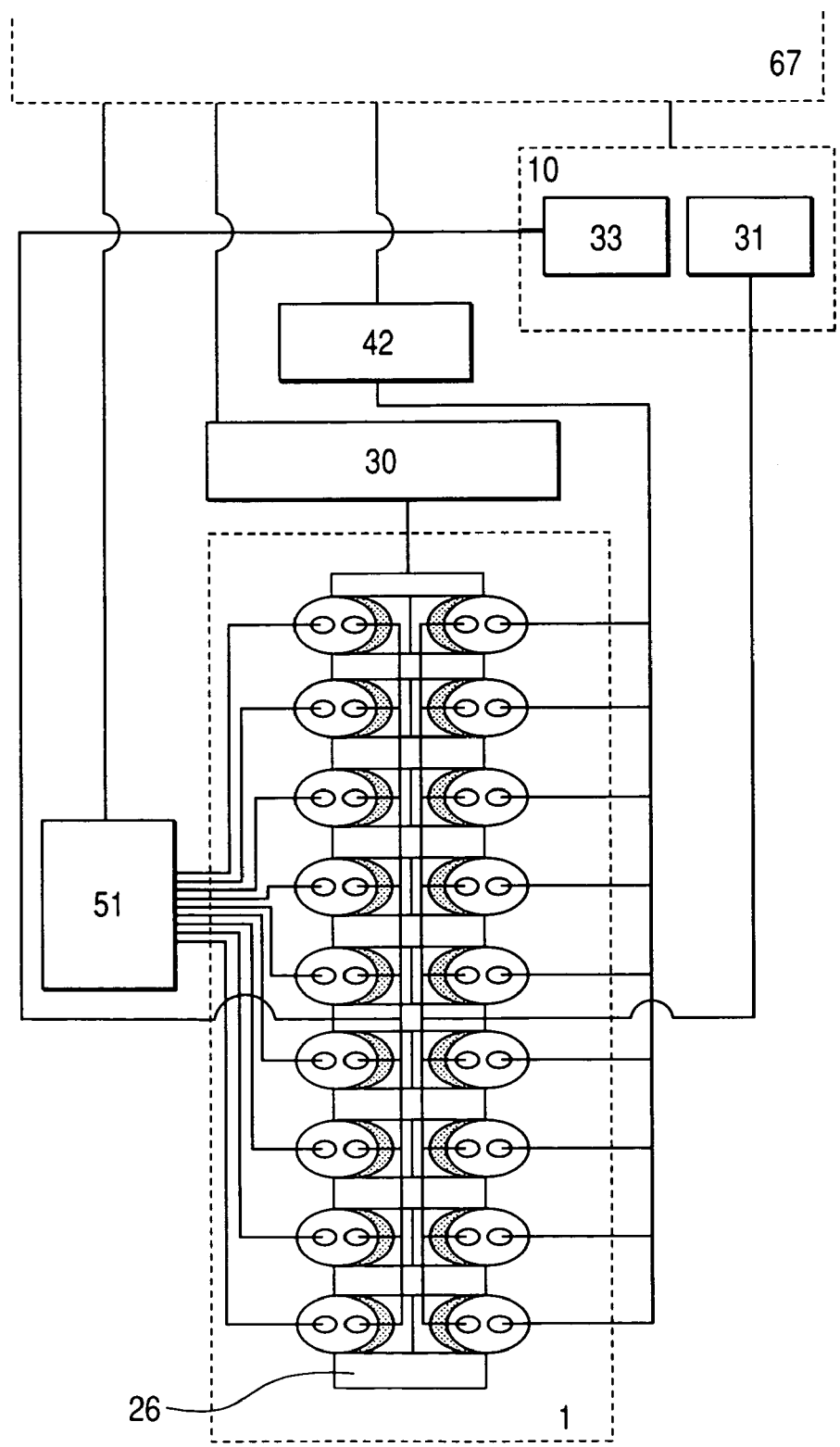
FIG. 11 is a diagram for explaining a second charge control system.

FIG. 11 is a diagram showing an internal structure of the charge control column 1 shown in FIG. 9, having a structure of the plurality of charge control units 28 explained in FIG. 10 arranged side by side. An electron source 2, the ExB deflector 21, and the grid B 22 shown in FIG. 10 are controlled by an electron gun power supply 42, a ExB power supply 31, and a constant voltage supply 33 in FIG. 9, receptively, which are collectively managed and controlled by the charge control system 67. Here, the electron gun power supply 42 for controlling the electron source 2 may be a parallel connection of a plurality of electron sources 2, which may be controlled as a single electron source. However, controlling the electron sources 2 separately makes it possible to correct individual differences of the electron sources 2g, and accordingly is better. Since the constant current power supply 31 and the constant voltage supply 33 need to supply the same fixed output, the both were specified to be the same. An ampere meter 14 connected with the metal plate 19 can measure a current for each charge control column, and sends a measurement result to a charge control system 29, where it is determined whether charge of the specimen has reached saturation. Moreover, an ampere meter 14 is installed individually, which makes it possible to detect a defect of the electron source 2, such as defect, individually.

FIGS. 12A and 12B show how the stand 26 moves in the case of controlling charge of the wafer 6 with a configuration of FIG. 11. FIG. 12A shows a case where the toolslide 26 is moved in the right-angled direction one dimensionally to the array direction of the charge control column 1, and FIG. 12B shows a case where the toolslide 26 is rotated around the charge control column 1e as a center. In the both cases, a distance between the wafer 6 and the charge control column 1 is almost constant and the charge control column shall move substantially in parallel to the plane of the wafer 6. Moreover, it is assumed that the charge control column 1 are arranged so as to be able to irradiate the electrons everywhere within the wafer 6 surface by the above-mentioned operation. Since, in the case of a large specimen, such as a semiconductor wafer and a liquid crystal display, moving an electron source cam make the instrument smaller than moving a specimen, reduction of installation area can be achieved compared to the instrument explained in the first embodiment.

In addition, when using the CNT cathode is used as an electron source of the charge control apparatus of this embodiment, it is recommended to configure the charge control column 1 with the differential pumping structure as in the case of the first embodiment. In order to realize the differential pumping structure with the charge control column 1 shown in FIG. 1, a hole diameter of the anode electrode 27 is made small to such a size that allows the primary electron beam 23 to pass through and an evacuation port (not shown in FIG. 10) is provided on the upper part of the anode electrode 27. By this structure, the degree of vacuum in the lower part of the anode electrode 27 and in the vicinity of the CNT cathode can be differentiated. An aperture that is different from the anode electrode 27 may be provided before or after the anode electrode 27 to realize the differential pumping structure. Alternatively, it is also possible to provide a small hole for allowing the primary electron beam 23 to pass through in the grid A 18 and thereby realize the differential pumping structure. Moreover, an instrument configuration in the case of feeding back an charge potential measurement for control of the instrument is almost the same as was explained in the first Embodiment 1.

Third Embodiment

In the first Embodiment, an example of the SEM type semiconductor inspection instrument where the electron beam emitted from the electron gun for charge control is irradiated in parallel to the specimen was explained. In this embodiment, another example of configuration of the SEM type semiconductor inspection instrument will be described. A feature of the SEM type semiconductor inspection instrument of this embodiment is a capability to realize charge control processing by incorporating a small electron gun into the conventional SEM column. At this time, electron illumination is done by the electron gun, and charge processing for controlling the charge is performed by using an charge control electrode provided in the SEM column.

Figure 13:
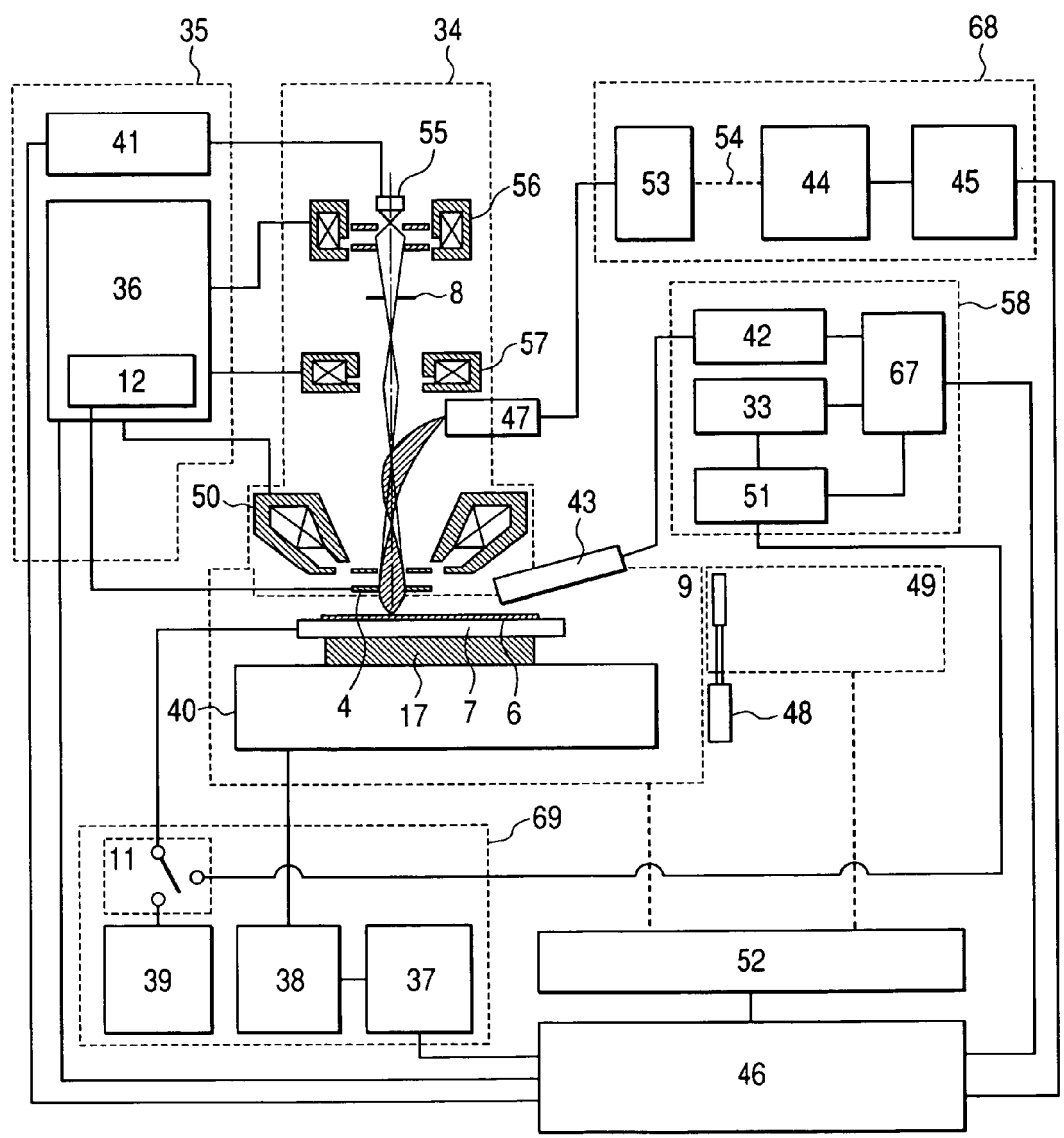
FIG. 13 shows a configuration of a semiconductor pattern inspection instrument equipped with a third charge control apparatus of a third embodiment.

FIG. 13 shows a general view of the semiconductor inspection instrument of this embodiment. The semiconductor inspection instrument of this embodiment is roughly divided into: an SEM column 34, a charge control column 1, the specimen chamber 9, the specimen preparation chamber 49, an SEM controller 35, a charge control system 58, an inspection system control unit 46, an charge control monitor unit 51, a vacuum system 52, the image formation unit 68, and the stage control unit 69, which are main constituents. The SEM column 34, the charge control column 1, the specimen chamber 9, and the specimen preparation chamber 49 shall be evacuated by the vacuum system 52. The reference numeral 48 denotes a gate valve, which becomes a boundary of the specimen chamber 9 on the instrument main body side and the specimen preparation chamber 49. The inspection system control unit is equipped with a GUI screen serving as a man-machine interface with the instrument user and data input means, such as a mouse and a keyboard. Here, constituents having the same reference numerals in FIG. 1 and FIG. 13 are the same in their functions and operations, respectively. Incidentally, a figure of the deflector 5 right above the charge control electrode 4 is omitted in the SEM column 34 of FIG. 13.

In FIG. 13, a CNT electron gun 43 is attached under an objective lens 50 to be able to irradiate an area almost equal to the inspection area or the area including its vicinity. Here, the inspection area in this embodiment is an area where electrons emitted from the SE cathode 55 incorporated in the SEM column 34 are converged and irradiate the wafer. The CNT electron gun 43 is attached obliquely so as to irradiate the area. Here, a merit of illuminating electrons obliquely relative to the wafer 6 is a high secondary electron emission efficiency compared to the case of normal incidence and consequently can omit a procedure of searching a condition that yields high secondary electron emission efficiency while changing incident energy, which is needed in the case of normal incidence. The inspection process and the charge control process are collectively managed and controlled by the inspection system control unit 46 based on inspection conditions and the processing conditions of charge control that the user enters through the user interface. In the inspection process, the relay circuit 11 of the stage control unit 69 switches to the retarding power supply 39, and the retarding voltage is applied to the wafer.

Next, an image of the inspection area is formed using electrons emitted from the SE cathode 55. Incidentally, at this time, the CNT electron gun power supply 42 controls the CNT electron gun 43 so that electrons emitted from the CNT electron gun 43 do not hinder formation of the above-mentioned image. As a concrete example, the high voltage is not applied to the CNT cathode 2. Alternatively, extractor voltage is made small so that the CNT cathode 2 does not emit electrons. On the other hand, in the process of charge control, the relay circuit 11 switches to the charge monitor portion 51, which enables the absorption current flowing into the wafer 6 to be monitored in the charge control process. Rendering charge uniform is performed by moving the stage 40 so that electrons irradiated from the CNT electron gun 43 irradiate everywhere an area wider than al least the inspection area of the wafer 6 and repeating this processing at least once or more times.

Figure 14:
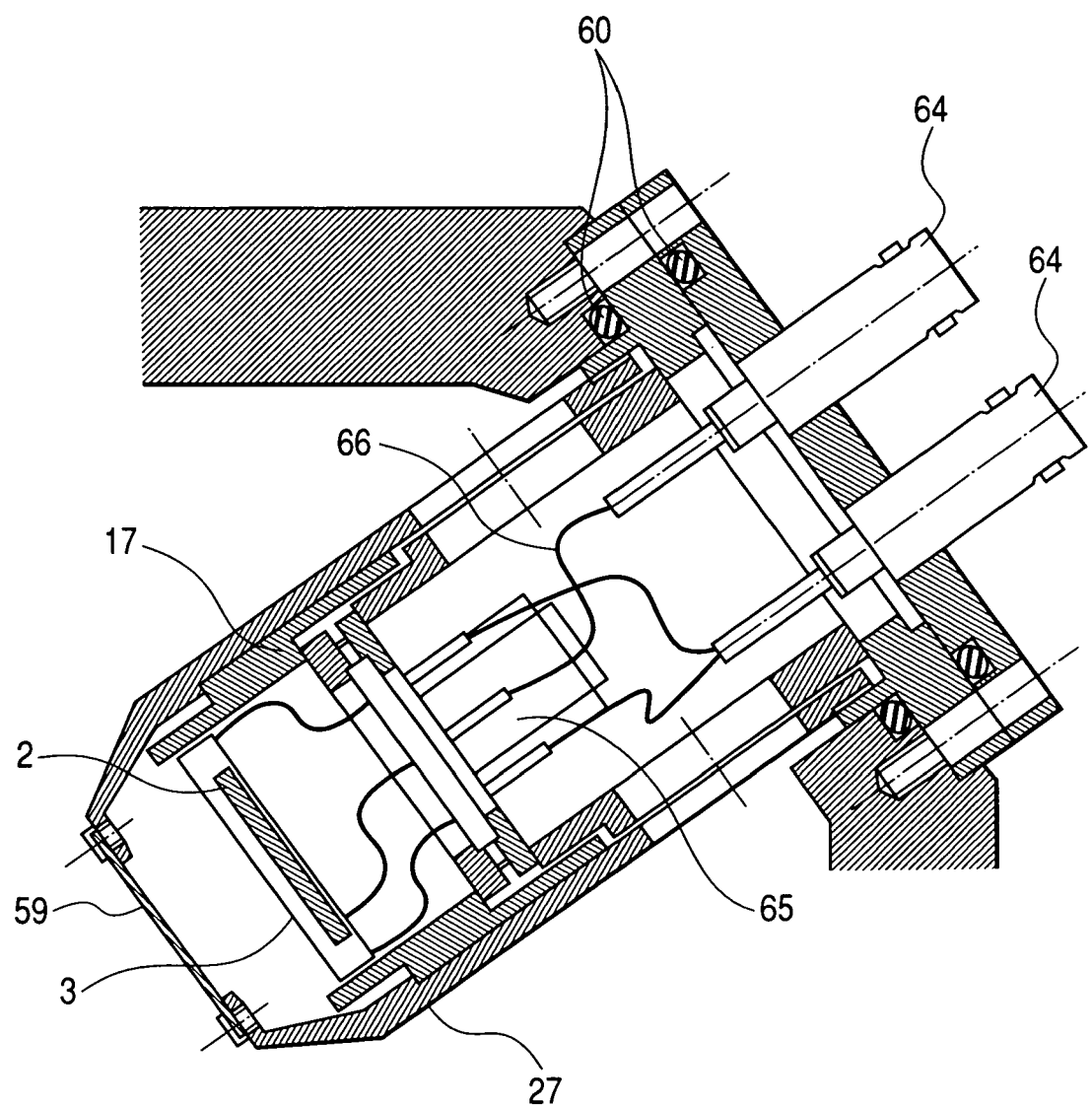
FIG. 14 is a schematic diagram of a CNT electron gun.

FIG. 14 shows in detail the structure of the CNT electron gun 43 shown in FIG. 13. The CNT electron gun 43 consists of the CNT cathode 2, an extraction electrode 3, a pin terminal 65, a feed through 64, and an anode electrode 27. The CNT cathode 2, the extraction electrodes 3, and the pin terminal 65 have an integral structure. The anode electrode 27 is in a cylindrical form and has an opening through which the electron beam emitted from the CNT cathode 2 passes in its front. In FIG. 14, a portion hatched obliquely shows the cross-section of a vacuum partition of the SEM column 34 of FIG. 13. When the instrument is in an operation, the inner side of this vacuum partition is in a vacuum and the outer side thereof is in an atmospheric pressure. The reference numeral 60 denotes an O-ring for vacuum seal.

This integral CNT cathode is electrically insulated to the anode electrode 27 by the insulator 17. By connecting the feed through 64 and the pin terminal 65 together with covered wire 66, a voltage is applied to the CNT cathode 2 and the extraction electrode 3. In order to prevent the CNT cathode 2 from being damaged by gas molecule or ion generated at the time of illuminating electrons on the specimen, a grid 59 for interrupting the gas molecule or ion not to reach the CNT cathode 2 is attached to a front opening part of the anode electrode 27. An aperture may be provided instead of the grid. The anode electrode 17 and the insulator 27 have holes by which the vicinity of the CNT cathode 2 is evacuated to a vacuum. With these holes, the degree of vacuum in the vicinity of the CNT cathode 2 is maintained almost equal to that in a vacuum chamber to which the CNT electron gun 43 is attached.

Figure 15:
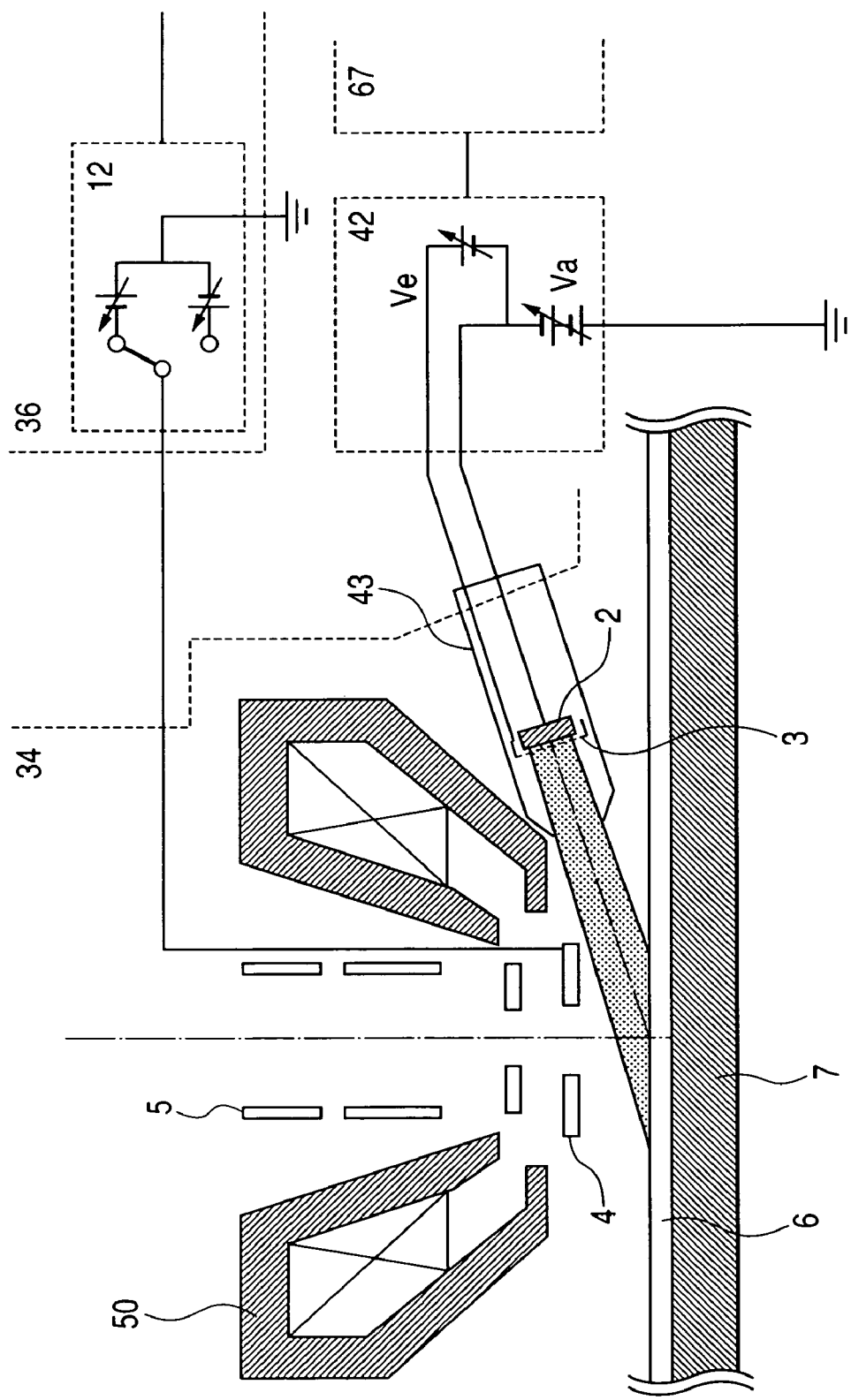
FIG. 15 is a block diagram of a third charge control apparatus.

Next, in FIGS. 15-16, an example where the charge control of the wafer 6 is conducted using the CNT electron gun 43 will be explained. FIG. 15 shows a schematic enlarged diagram of the vicinity of the wafer 6 of FIG. 13. A figure of a part of the SEM column 34 above the objective lens 50 is omitted. The CNT electron gun 43 mainly consists of the CNT cathode 2 and the extraction electrodes 3. Electrons extracted from the CNT cathode 2 by a potential difference between the extraction electrode 3 and the CNT cathode 2 irradiate obliquely an intersection of a substantially center axis of the SEM column 34 and the wafer 6 with energy corresponding to the negative electrode voltage applied to the CNT cathode 2. A voltage of a positive polarity or negative polarity with respect to the potential of the wafer 6 can be applied to the charge control electrode 4. A switch in the control electrode power supply 12 can switch the polarity to the opposite. This polarity switching can adjust the wafer 6 surface so as to have an arbitrary voltage. In FIG. 15, the CNT electron gun 43 is connected with the CNT power supply 42. The CNT power supply 42 is equipped with two variable power supplies, which correspond to variable power supplies Ve and Va shown in FIG. 10. The CNT power supply 42 is further connected with the charge control apparatus 67, and the charge control apparatus 67 controls the set voltages of the variable power supplies Ve, Va.

Figure 16A:
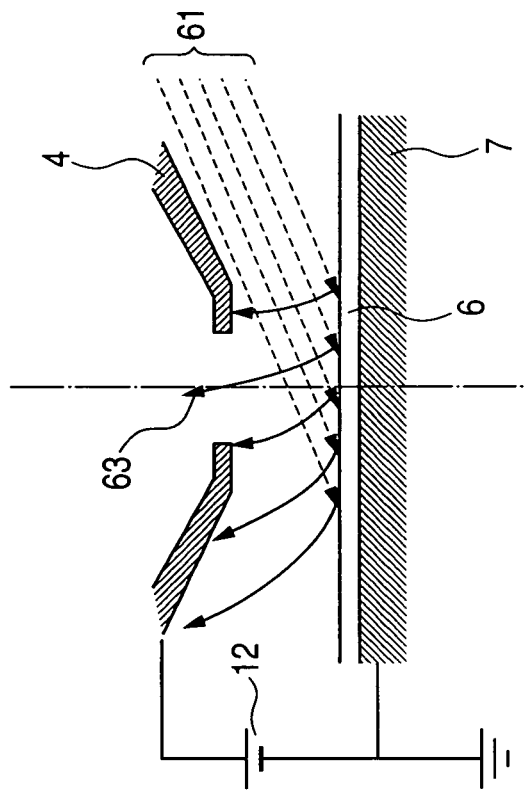
FIG. 16A is a schematic diagram of electron trajectories at the time of charge control.
Figure 16B:
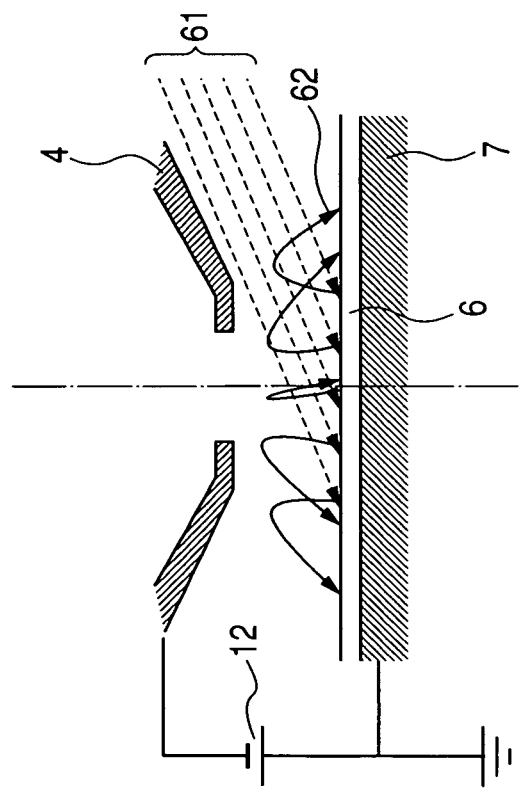
FIG. 16B is a schematic diagram of electron trajectories at the time of charge control.

FIG. 16A shows a case where the wafer 6 is electrified negatively, and the charge control electrode 4 is applied a negative voltage to the wafer 6. The dashed line 61 shows the electrons 61 emitted from the CNT cathode 2, and shall irradiate an area substantially right below the charge control electrode 4. The secondary electrons 62 emitted from the wafer 6 are returned to the wafer 6 by a negative voltage applied to the charge control electrode 4. As a result, a wafer 6 is electrified negatively. FIG. 16B shows a case where the wafer 6 is electrified positively, a positive voltage to the wafer 6 being applied to the charge control electrode 4. In this case, since the secondary electrons 63 generated by the wafer 6 are drawn by the charge control electrode 4, the wafer 6 is electrified positively.

Figure 17:
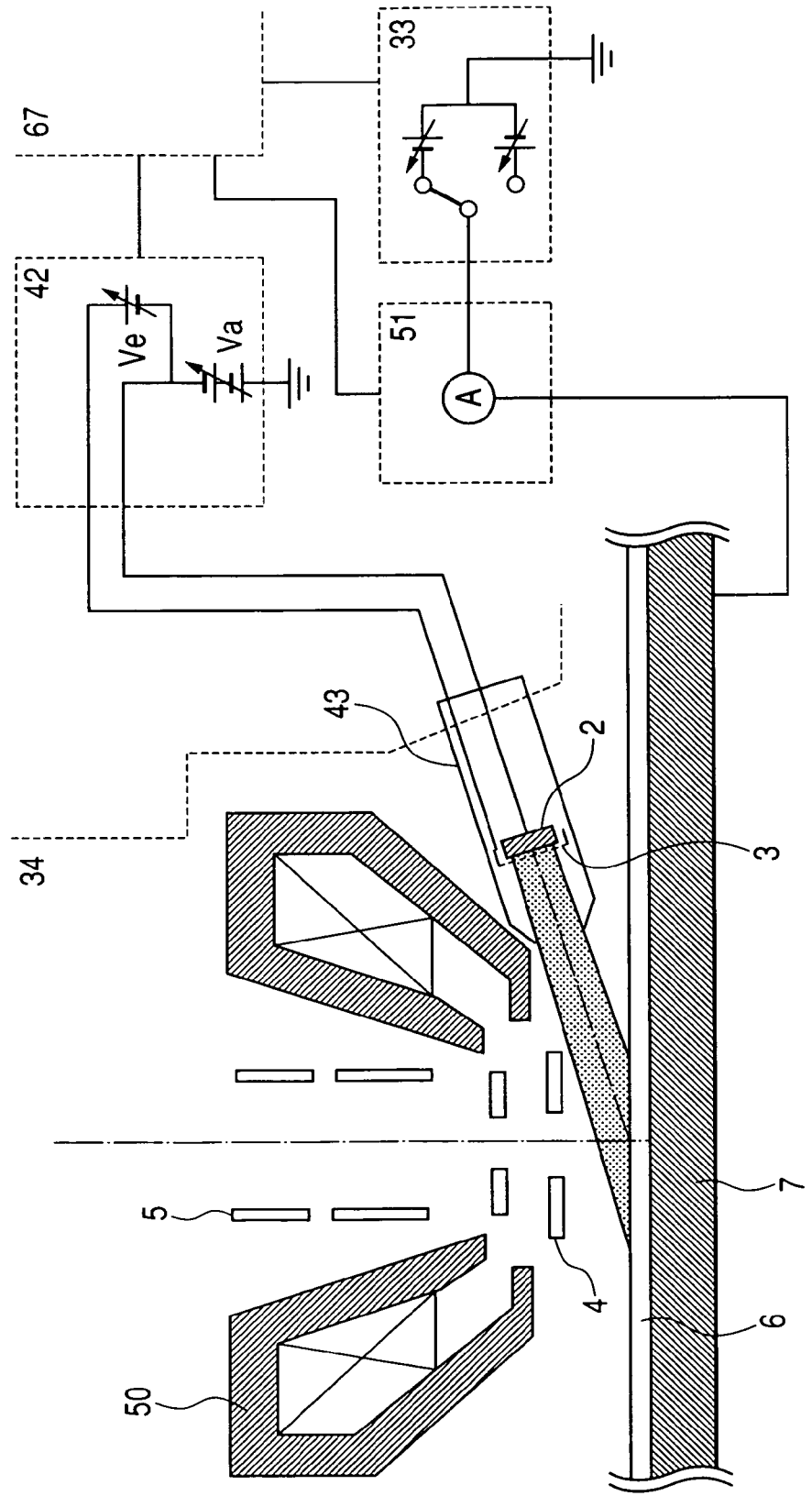
FIG. 17 is a block diagram of the third charge control apparatus.

FIG. 17 is a schematic enlarged diagram of the vicinity of the wafer 6 of FIG. 13. This is a diagram for showing an example of controlling charge by a method different from those of FIGS. 15-16. In FIGS. 15-16, an electric field was formed on the wafer 6 by applying a voltage to the charge control electrode 4, and charge was controlled. In FIG. 17, the charge control electrode 4 is set to the ground potential and a voltage is applied to the wafer, whereby charge is controlled.

The method for controlling charge shown in FIG. 17 can be realized by providing the charge monitor portion 51 in the instrument of a configuration shown in FIG. 13. In FIG. 17, the CNT electron gun 43 is connected with the CNT power supply 42. The CNT power supply 42 has two variable power supplies, which correspond to variable power supplies Ve and Va shown in FIG. 10. The CNT power supply 42 is connected with the charge monitor portion 51 and the charge control apparatus 67, and the charge monitor portion 51 is connected with the voltage source 33 and the wafer holder 7. The voltage source 33 has two kinds of voltage sources each having a different polarity, and has switching means for switching over the two kinds of voltage sources (relay switches etc.). The switch means of the voltage source 33 is switched over by a signal from the charge control apparatus 67. Incidentally, in FIG. 17, the SEM column 34 is shown with illustration of a portion above the objective lens 50 of the SEM column omitted. Moreover, although illustration is omitted in FIG. 17, the objective lens 50 is connected with the lens controller 36; the charge control electrode 4 is connected with the charge control system 58; and the deflector 5 is connected with a control unit for the deflector.

The CNT electron gun 43 consists mainly of the CNT cathode 2 and the extraction electrode 3, wherein electrons extracted from the CNT cathode 2 by a potential difference between the extraction electrode 3 and the CNT cathode 2 irradiate obliquely an intersection of a substantially center axis of the SEM column 34 and the wafer 6 with the help of energy corresponding to a negative electrode voltage applied to the CNT cathode 2. The method for controlling charge sets the charge control electrode 4 to an earth potential, applies a voltage to the wafer 6 with the voltage source 33 whose polarity is switchable through the charge monitor portion 51, and controls the charge voltage by the voltage setting of the voltage source 33. For example, when the wafer 6 surface is intended to be electrified negatively, a voltage of positive polarity is applied to it with the voltage source 33; when the wafer 6 surface is intended to be electrified positively, a voltage of a positive polarity is applied to it with the voltage source 33. Moreover, when the wafer 6 surface is intended to be electrically discharged, a voltage source 33 is set to approximately 0 V. The method for monitoring charge of a wafer is the same as in the case of FIG. 6 and FIG. 7 described above, that is, when a temporal variation of the absorption current measured by the charge monitor portion 51 becomes practically zero, it is considered that the wafer 6 is in a state of charge saturation.

A charge required to generate charge saturation is dependent on a material of the wafer surface, surface profile, the existence of junction, etc. Therefore, in order to conduct charge control with the above-mentioned configuration, it is necessary to adjust both a current of the electron beam for illuminating the wafer 6 and a voltage of the voltage source 33, while monitoring a progress of the charge with the ampere meter 51. Specifically, if the temporal variation of the absorption current does not become zero, charge given to the wafer is insufficient. Therefore, Ve of the CNT electron gun power supply 42 is increased to increase the current of the electron beam for illuminating the wafer. Moreover, if there is no temporal variation of the absorption current but a large amount of absorption current flows constantly, this indicates the charge has reached saturation but the voltage of charge saturation is low compared to a voltage being set with the voltage source 33. Therefore, the voltage of the voltage source 33 is increased.

Figure 18:
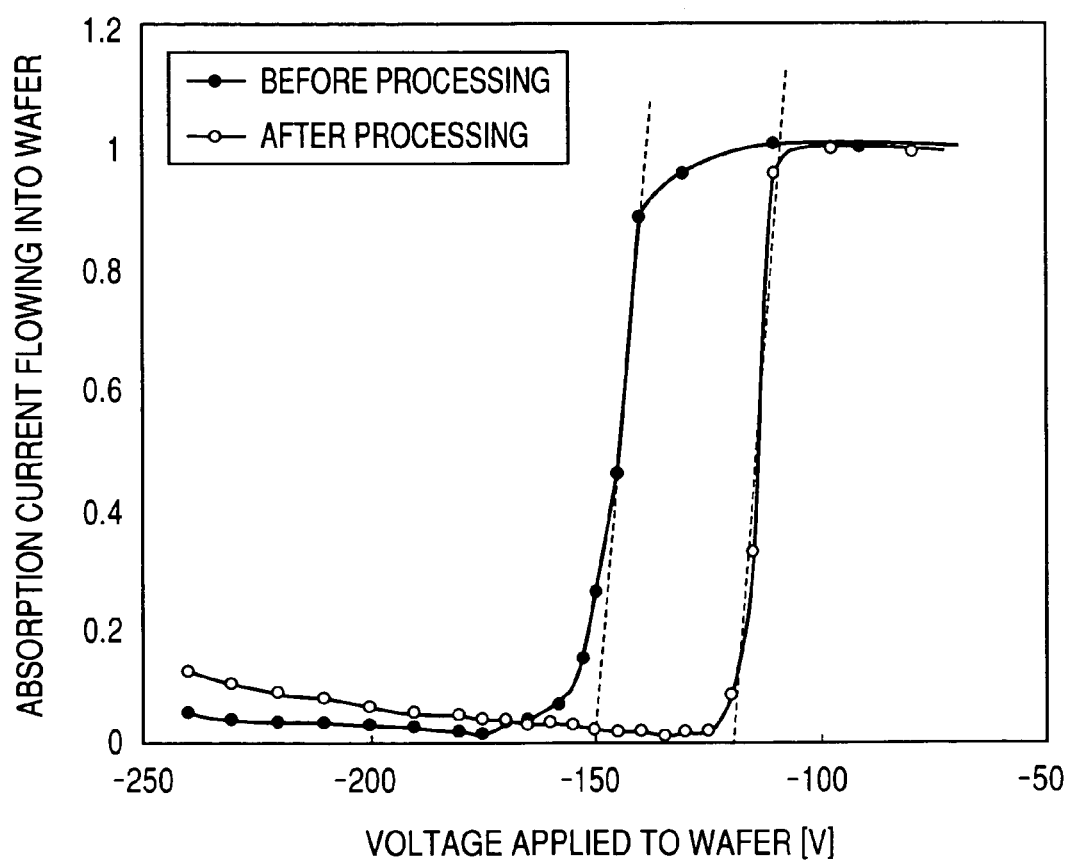
FIG. 18 is a graph of an example where charge control processing of the third embodiment is conducted and charge measurement is done.

FIG. 18 is a result of charge control processing on a semiconductor wafer whose surface is covered with $SiO_2$ film in the configuration of FIG. 17, and the result was obtained by measuring a voltage of the wafer surface before processing and a voltage of the wafer surface after the processing. Measurement of voltage can be achieved with a configuration shown in FIG. 17, that is, a voltage applied to the wafer 6 is varied continuously in a state where the CNT electron gun 43 is performing electron illumination, and the absorption current flowing into the wafer 6 is monitored by the charge monitor portion 51, which makes the measurement possible. FIG. 18 shows the absorption current flowing into the wafer on the vertical axis as a function of a voltage applied to the wafer on the horizontal axis. This shows results of the absorption current measured by the charge monitor portion 51 each time when a voltage applied to the wafer 6 is varied from about −250 V to 0 V stepwise with an acceleration voltage of electrons emitted from the CNT electron gun 43 being set to 200 V. Explaining a characteristic of the absorption current before processing as an example, on the condition that a voltage applied to the wafer 6 is higher than energy of electron irradiated from the CNT electron gun 43, that is, at a voltage of −240 V to −160 V in the figure, the electrons do not reach the wafer 6, and consequently the absorption current is hardly measured. Moreover, since at a voltage higher than −140 V all the electrons reach the wafer, the absorption current reaches saturation. What should be paid attention in this method, the measurement must be done from the condition that the electron emitted from the CNT electron gun 43 does not reach the wafer 6 (the voltage is altered from −250 V to 0 V). If the measurement is started from the condition that electrons reach the wafer 6 (the voltage is altered from 0 V to −250 V), charge of the wafer surface suffers variation during the measurement. Charge control was done by applying a voltage of 30 V to the wafer 6 and illuminating the electron beam at an acceleration voltage of 1200 V from the CNT electron gun 43 in the structure shown in FIG. 17. It can be observed that a characteristic curve of the absorption current has shifted by 30 V after the processing compared to before. Thus, a volt value at which the wafer was relatively electrified after the processing can be actually measured by measuring the characteristic curve of the absorption current. For example, in the above-mentioned example, a voltage of 30 V is applied to the wafer 6 and charge processing is performed, and as a result it can be checked that the wafer 6 surface is electrified by about −30 V. A method where a result of the surface potential is fed back to control the SEM column and the CNT electron gun is almost the same as a method explained in the first embodiment.

As shown above, the charge control means of a configuration shown in this embodiment can be inserted easily in a space of a narrow working distance between the objective lens and the specimen because of the use of a small-size electron gun. Therefore, charge control means can be installed in the SEM type inspection instrument of an existing configuration without needing special design alteration, and so it is possible to realize an instrument having an charge control function with relatively low cost compared to the charge control device explained in the first embodiment. Moreover, the charge control apparatus of this embodiment is small in size and can be installed to other charged particle application instrument, not limited to the wafer inspection instrument. Therefore, also in other charged particle application instrument, the small electron gun of this invention can be incorporated and its effect can be checked.

Fourth Embodiment

In this embodiment, a method of charge processing performed by the user of the device to which this invention is applied and its flow will be explained. The charge processing flow explained below can be performed in any of the charged particle beam application instrument shown in the first to third embodiments. Moreover, in each of the charged particle beam application instrument shown in the first to third embodiments, the inspection system control unit 46 shall have storage means that sores inspection recipes, operation means for conducting predetermined controls, and input means (a mouse, a keyboard, etc.) for allowing the user to enter necessary information. Further, the charged particle beam application instrument shown in the first to fourth embodiments shall be each equipped with a monitor for displaying a GUI screen.

(Creation of Recipe)

Figure 19:
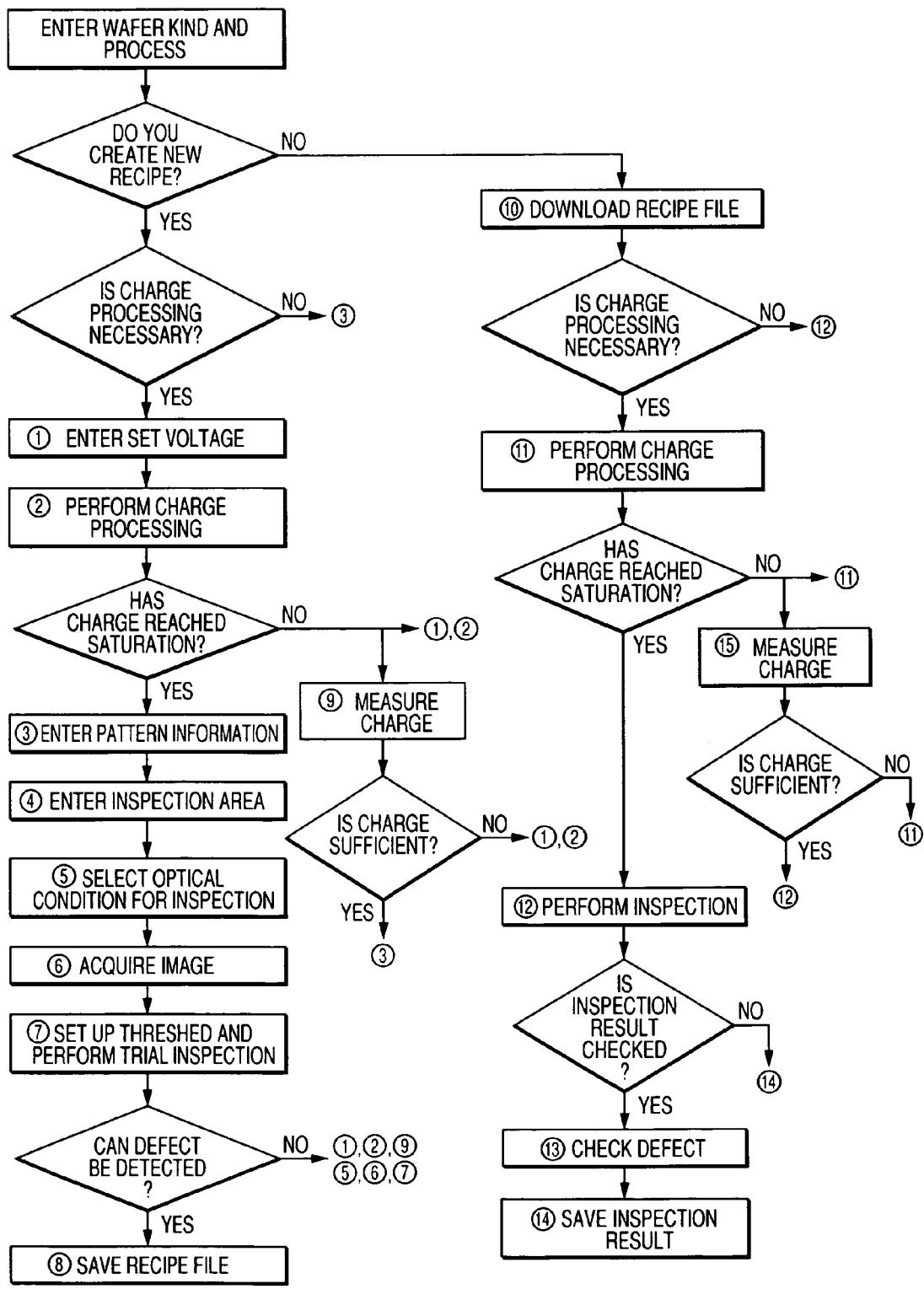
FIG. 19 is a diagram for explaining a procedure of inspecting a semiconductor pattern.

First, a flow for a case of creating a recipe newly will be explained. FIG. 19 shows a flowchart for process of recipe creation and inspection when performing pattern inspection using an inspection recipe. The user enters information of a type of a wafer to be inspected and a process, and the instrument determines whether the charge processing is necessary. When the processing is unnecessary, the flow proceeds directly to "(3) Enter information of pattern" and the flow advances the creation of a recipe. When the processing is necessary, the user enters a desired charge potential, the number of times of illumination, etc. in "(1) Enter set voltage." Details regarding entry items being referred to here will be explained later in (GUI screen of charge processing). After entering a set voltage, the flow proceeds to "(2) Execute charge processing," where charge is monitored as shown in the first to fourth embodiments and it is determined whether the processing is completed. Determination of the completion of the processing here is done by the instrument based ion thresholds of both a criterion described in each embodiment and a criterion fixed by the user. When the processing is completed, the flow proceeds to "(3) Enter information of pattern," where the user enters design information of a pattern, such as a die, a cell, and an alignment mark that constitute the pattern. Subsequently, the flow performs "(4) Enter inspection area," "(5) Enter optical conditions," "(6) Acquire image," and "(8) Set threshold and perform trial inspection" based on information of the pattern. As a result, if a defect can be detected appropriately, the flow performs "(8) Save recipe file." On the other hand, when a defect is undetectable, or when proper inspection is not operable because unclear contrast of a pattern, drift in a focus of an image at the time of inspection, unevenness in brightens of an image, etc., the flow goes back to setting of charge processing or optical conditions again, and the same operation as described above is repeated. When charge does not reach saturation depending on an inspection target wafer or when charge reaches saturation but problems such as focus drift, unevenness in brightness of an image, etc. occurs in the inspection, the flow proceeds to "(9) Measure charge," where a state of charge in a wafer surface is measured. Here, charge may be measured by a measurement method shown in FIG. 18, or reduced from a value of an charge potential meter and a focus value of an objective lens. Here, parameters and a procedure that the user defines in measuring charge will be described in (GUI screen of charge measurement) that will be explained later. A recipe file that will be saved finally stores information of charge processing conditions, when the charge processing was done, and information of measurement conditions and results, when the charge measurement was done, in addition to information of a pattern necessary for inspection and information of optical conditions of the inspection, a threshold for defect detection, image calibration, etc.

(Inspection)

An inspection flow in FIG. 19 starts from "(10) Load file of recipe," where information necessary of inspection described previously is read. If the charge processing is not performed, the flow directly proceeds to "(12) Execute inspection"; if the charge processing is not performed, it performs the processing in the same procedure as (Recipe creation). Here, the recipe file stores the result of charge processing at the time of recipe crate or, for a wafer that has precedent inspection of a wafer of the same kind and the same process, the result of the previous result of charge processing, and the wafer shall undergo the processing so that always the same charge is formed. After this processing, either when the charge does not reach saturation or when the wafer always goes through a process of charge measurement, the flow proceeds to "(15) Measure charge," and after the measurement proceeds to either "(11) Execute charge processing" or "(12) Execute inspection." On the other hand, when not performing "(15) Measure charge," the flow directly proceeds to "(12) Execute inspection." Regarding the inspection result, even in normal inspection, in addition to information of coordinates of a defect, the size of the defect, contrast of the defect that are saved, when the charge processing was performed, a result of the processing is saved, and when the charge measurement was conducted, a result of the measurement is saved.

(GUI Screen of Charge Processing)

Figure 20B:
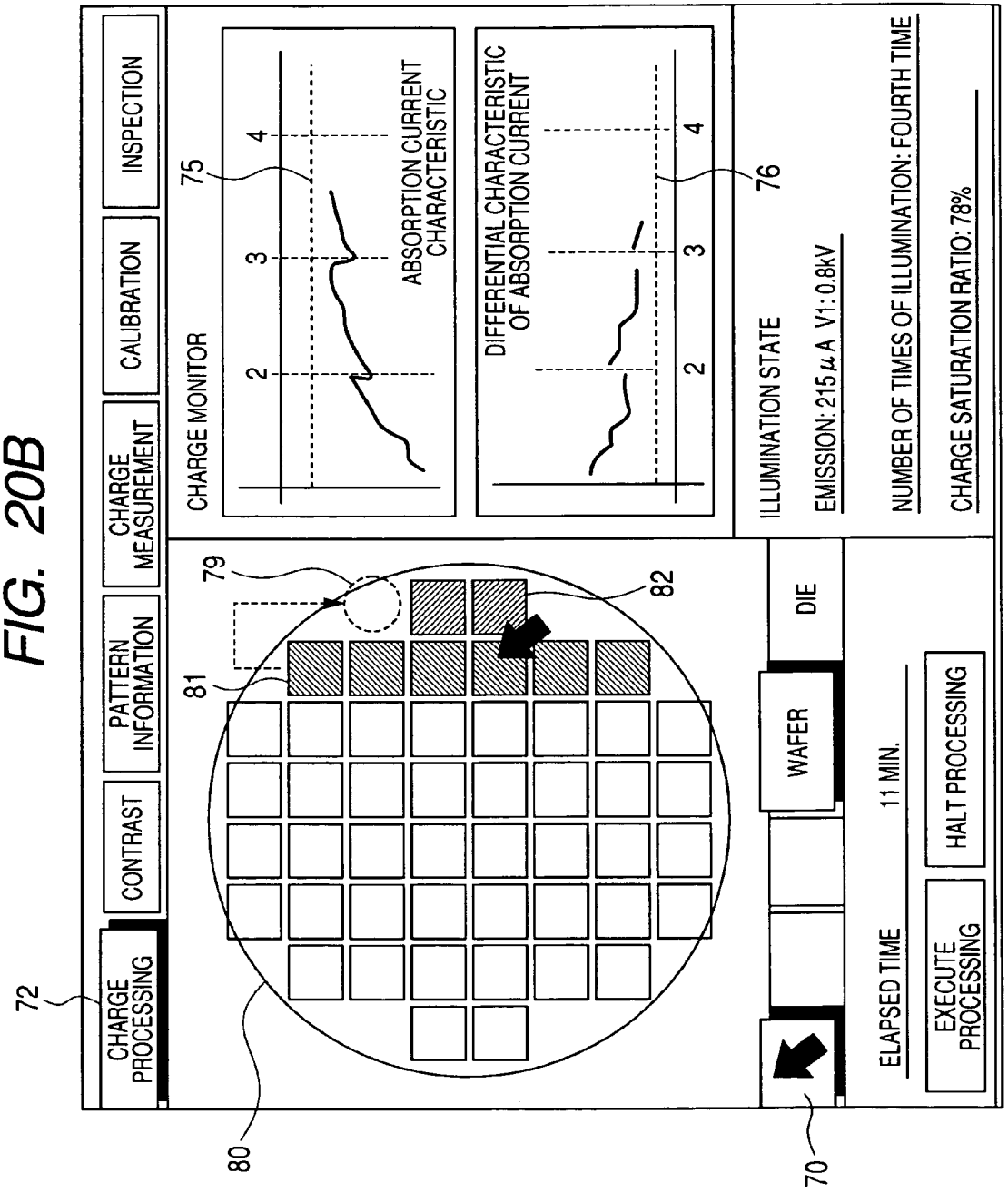
FIG. 20B is a diagram for explaining the GUI screen of charge processing.

A composition of a GUI screen of the charge processing and minimum functions included therein will be explained using FIG. 20. FIG. 20A is a setting screen of the charge processing, and FIG. 20B is a screen while the charge processing is being performed. In the flowchart shown in FIG. 19, after the end of Step (1) or when it is determined as YES, in determination Step (12), a GUI screen shown in FIG. 20A is displayed on the monitor. FIG. 20A is a setting screen of the charge processing, which is composed of a layout screen 80 of a pattern in the wafer, a setting screen of charge processing, a screen of electron gun illumination conditions, etc. Items that the user is allowed to operate are a button A 70 for specifying an illumination area and the like, a button B 71 for selecting information stored in the instrument with a pull down function, an entry field 73 that reflects a result of pull-down functions of the button B 71 allows the user to enter directly a numeric value or text, a check box 77 that allows the user to specify the necessity of charge processing, etc. Specification of the illumination area is done by a cursor designated by an arrow on the layout screen 80. Selection of necessity of this function in the charge processing is determined by the existence of a check in the check box 77 at the uppermost part in the setting screen of charge processing. If the box is checked, all entries in the screen of charge processing become possible, and information of entries here and results of the processing are save in the recipe file, which enables charge processing to be performed automatically at the time of inspection. If the charge processing is unnecessary, a check in the check box 77 is removed, and a button C 72 for selecting a function screen is operated to get a screen of charge measurement or other functions, which allows the flow of the recipe creation to proceed further.

When performing the charge processing, items entered on the setting screen are a pattern layout, a processing mode, a set voltage, a sampling ratio, an upper limit of the number of times of illumination, and an charge saturation ratio. All these items were given default values at the time of instrument shipping, and the user can determine freely whether a default value is used or is customized. The pattern layout is provided in order to define an area which the charge processing is performed, a layout of a pattern that is an inspection target and can be set on a function screen of the pattern information can be read as well as several typical layouts. The processing modes included electron discharge, charge, and as another thing, electron discharge plus charge, etc. When only electron discharge is selected, the set voltage becomes entry-impossibility. The set voltage is specified by entry of voltage value with specification positive or negative polarity; in the case of positive polarity the wafer is charged positively, and in the case of negative polarity, the wafer is charged negatively. The sampling rate is a numeric value to specify a parentage of a partial area being irradiated to the illumination area that was entered on the layout screen 80. In the case of a sampling rate of 100%, the whole surface is subjected to charge processing; in the case of 50%, a half of the specified area is processed by charge. The user can freely set as to which area in the specified area is processed in order to subject an area to be processed with a set sampling ratio to charge processing. The upper limit of the number of times of illumination defines an allowable number of times of illumination on a specified area. In the case where the charge saturation factor that will be explained later is not satisfied within the number of times of illumination specified here, the process is forcedly halted. An charge saturation factor is a parameter indicating a degree of achievement of charge saturation, and is set by the instrument user. Specifically, it is shown by a ratio of the set voltage and an actually measured potential of the wafer. In this embodiment, the actual potential of the wafer is obtained by converting an absorption current value observed at the time of charge monitoring in to a potential of the wafer using a proper function. It is also possible to calculate the actual potential of the wafer using an observation parameter other than the absorption current. Alternatively, the surface potential of the wafer may be directly measured using a surface electrometer etc. When the ratio of the set voltage and the actually measured potential of the wafer satisfies the charge saturation factor, the instrument determines that charge of a predetermined part of the wafer has reached saturation (FIG. 19, determination Step after Step (2) and Step (11)), and ends the charge processing. When the charge saturation factor is 100%, it means that the specimen has reached saturation completely. Here, even if a set value of the charge saturation factor is the same, the actual potential of the wafer at the time of the end of determination of the charge processing may vary depending on a method for monitoring the electrified state of the specimen. This is because the actually measured potential of a wafer varies with a method for monitoring the electrified state of a specimen.

In a screen of electron gun illumination conditions, the user is allowed to enter emission conditions of the electron gun for charge processing and an acceleration voltage. In the last-time illumination condition, a latest electron gun working status is displayed according to the emission condition that the user entered in a screen of electron gun illumination condition; in Emission, actual emission output in contrast to a set value in emission condition of electron gun illumination condition; and V1 indicates a value of an anode voltage at that time. By pushing a button of processing execution in the lower left of this setting screen of the charge processing, the charge processing specified by the user is performed and an operation screen switches to a screen of Charge Processing Under Way. Next, a screen of Charge Processing Under Way" in FIG. 20B will be explained. In the GUI screen of FIG. 20A, when the instrument user presses a button "Perform Processing" in the lower left of the screen, the monitor screen is switched over to a GUI screen shown in FIG. 20B. The screen of Charge Processing In Execution of FIG. 20B is mainly composed of a layout screen 80 of a pattern in the wafer, a screen of charge monitor, and a screen of electron gun illumination state, and an item the user can operates in the screen of Charge Processing In Execution is only processing halt located in the lower left of the screen (a button). The layout screen 80 of the pattern indicates as to which area is currently processed in the wafer. Contrast to a color of a specified illumination area 82, an area 81 on which illumination has been done changes its color, whereby the user can check a progress of the processing in real time. Incidentally, FIG. 20B shows a state where only dies in the right two columns in the wafer are specified to be processed, all dies in the second column from the right have been irradiated and dies on the first column from the right will be irradiated next. The charge monitor screen displays a monitor result of a wafer being processed, which allows the user to check the current progress status in contrast target charge defined by the charge saturation ratio that the user specified in the setting screen. FIG. 20B shows a case where the absorption current flowing into a wafer is used as a method for monitoring the charge by way of example, a graph placed upper part of the charge monitor screen shows a characteristic of temporal variation of the absorption current and a graph placed lower part thereof shows a temporal variation of time differentiation of the absorption current. From the set voltage and a set value of the charge saturation ratio shown in the setting screen of the previously-done charge processing, a target value 75 of the absorption current and a target value 76 of temporal differentiation of an absorption current are determined, while the user can check a progress of the current processing in real time in contrast to respective target values. Moreover, the user can check an illumination status of the electron gun, the current number of illumination, a current value of the charge saturation factor obtained from the results of the charge monitor described previously on a screen of illumination status. The user checks the charge monitor and progress in the screen of illumination status, and when the user considers that normal charge processing is not being performed, the user can halt the processing anytime by pressing a processing halt button.

(GUI Screen of Charge Measurement)

Figure 21A:
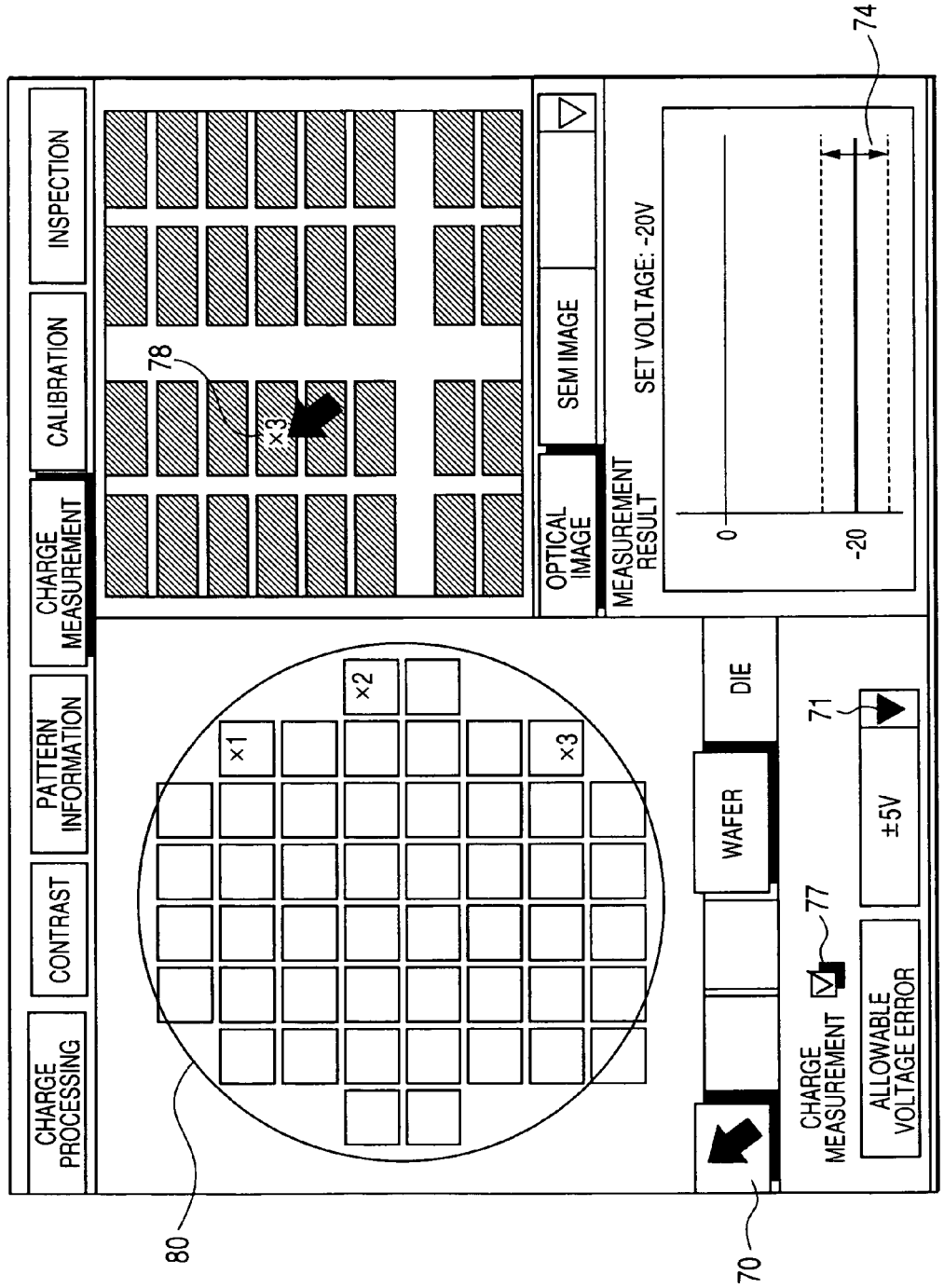
FIG. 21A is a diagram for explaining the GUI screen of charge measurement.
Figure 21B:
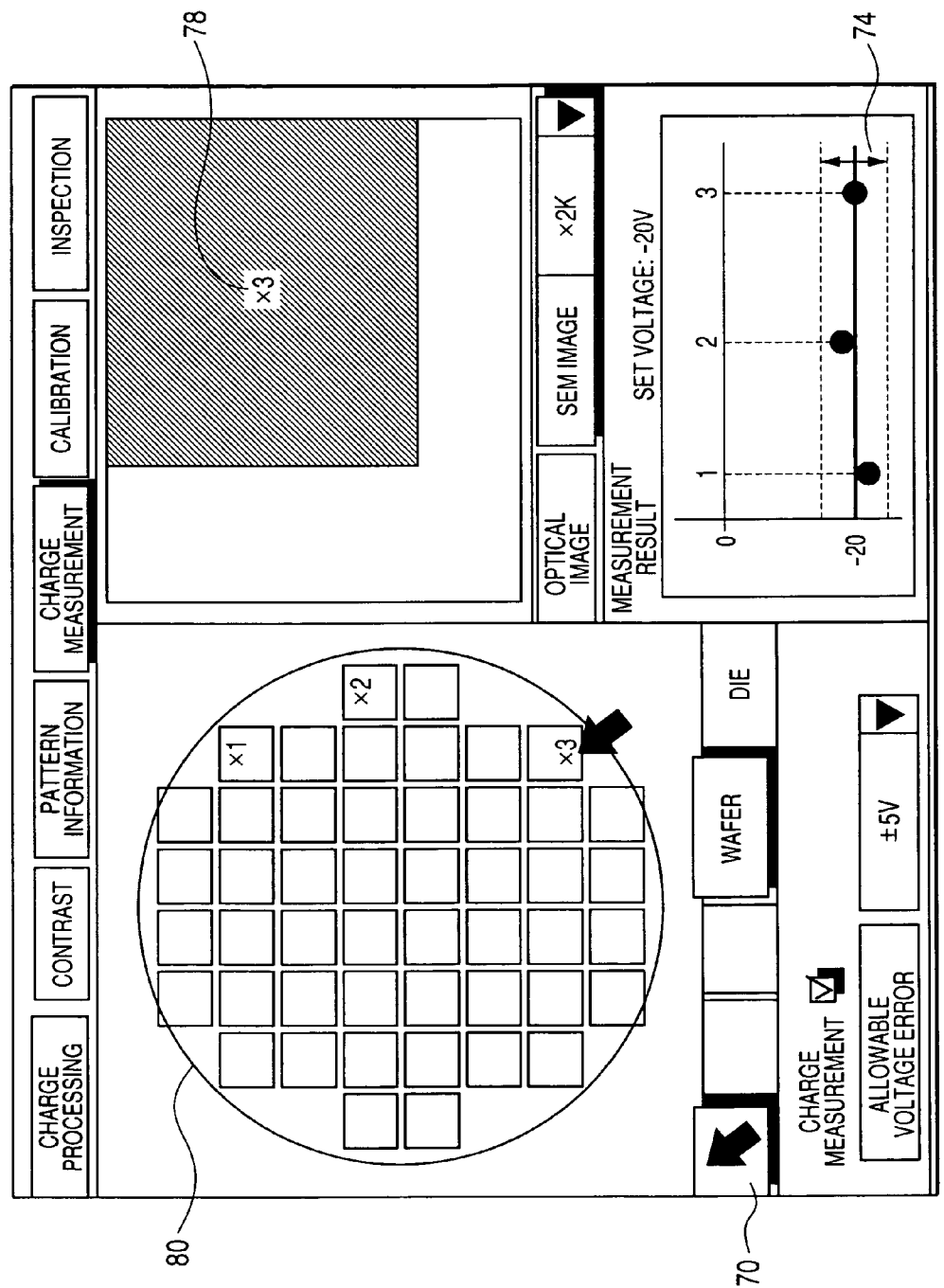
FIG. 21B is a diagram for explaining the GUI screen of charge measurement.

A composition of the GUI screen of charge measurement and minimum functions included therein will be explained using FIG. 21. FIG. 21A is a setting screen of measuring point of charge measurement and FIG. 21B is a screen displaying measurement results of charge measurement. First, the setting screen of the measuring point of charge measurement in FIG. 21A will be explained. In the processing flow shown in FIG. 19, when the processing moves to Step of charge measurement (9) or (15), display of the monitoring screen will change to a GUI screen shown in FIG. 21A. The setting screen of measurement part is composed of the layout screen 80 of a pattern in the wafer, a display screen of an optical image and an SEM image, and a display screen of measurement results. Items that the user can operate is composed of a button A 70 for specifying a measuring point and the like, a button B 71 for selecting information stored in the instrument by a pull-down function, and a check box 77 for specifying necessity of charge measurement. Selection of necessity or not necessity of this function of charge measurement is determined by a check or non-check on the check box 77 located in the lower left in the setting screen of charge measurement. When the box is checked, all entries on a screen of charge measurement are made possible. Information entered here and results of measurement are saved in the recipe file and the charge measurement is automatically conducted at the time of inspection. When the charge measurement is unnecessary, the user removes a check in the check box 77 and presses the button C 72 for changing the function screen to effect change-over to a screen of contrast or other function, whereby the user proceeds recipe creation further. When conducting the charge measurement, items that the user inputs on the setting screen is the button B 71 equipped with the pull-down function, whereby the user can define the allowable voltage error to the set voltage entered on the functional screen of charge processing. Moreover, when not performing the charge processing, the allowable voltage error can be entered. At that time, a voltage error with respect to a reference of 0 V is entered. When having performed charge processing, the layout screen 80 of a pattern displays a pattern layout that was used at that time; when not having performed charge processing, the pattern layout screen displays a pattern layout of an inspection target that was entered in the function screen of the pattern information. A plurality of (more than one) measurement areas can be specified. The user can specify desired areas on the layout screen of a pattern by pressing the button A 70 or by specifying it on an optical image or an SEM image. FIG. 21B is a screen displaying measurement results of charge measurement, and the results can be displayed as a graph or table on the measurement result screen. The allowable voltage error defined previously corresponds to a voltage error range 74 in the graph. If the measurement result fall in this range, the instrument determined that it is satisfactory. Data of coordinates of the measuring point, measurement results, and data of allowable voltage error registered on this screen are saved in a recipe file. When charge measurement is conducted even at the time of inspection, charge is measured at the coordinates registered here at any time, and the instrument shall manages the measurement result in terms of whether it falls in the range of allowable voltage error. If the measurement result by charge measurement does not fall in the allowable range during inspection, any of the following processing can be specified: the flow goes back to "charge processing" and the processing is performed; or the inspection is continued disregarding the measurement result; or the inspection is interrupted. The flow and the GUI screen shown in this embodiment are summation of functions that are needed at minimum in the pattern inspection instrument equipped with functions of charge processing and charge measurement function. These functions can be applied to an instrument using large particles, such as a pattern measurement apparatus. By applying the GUI screen and its control and processing functions shown in this embodiment to a wafer inspection instrument, operability of the instrument is improved.

Fifth Embodiment

Figure 22:
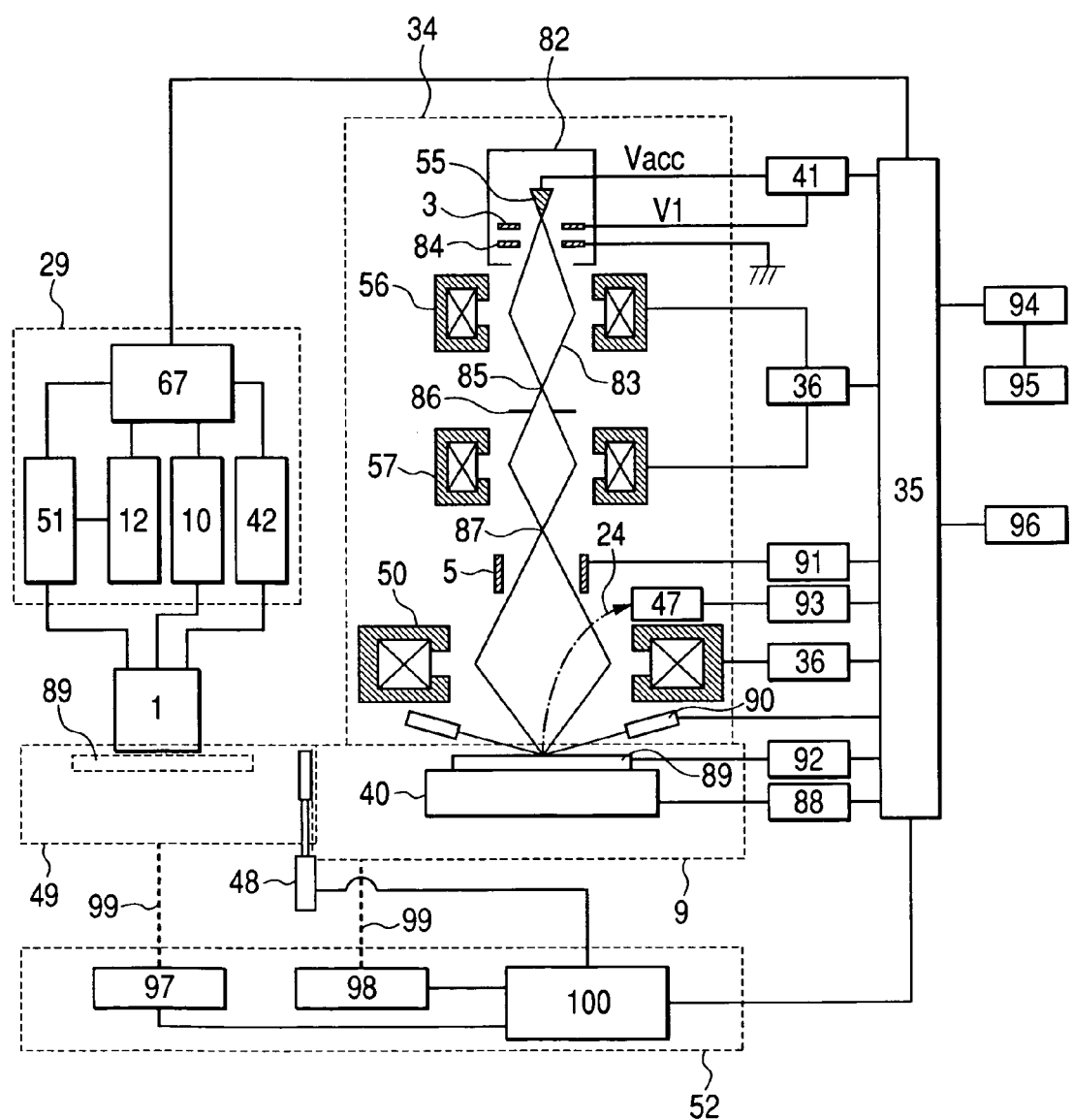
FIG. 22 is a block diagram of a CD-SEM equipped with the charge control apparatus of a fifth embodiment.

In this embodiment, an example of application to the scanning electron microscope equipped with a length measurement function. The scanning electron microscope equipped with a length measurement function may often be called a measurement SEM or CD-SEM (Critical Dimension measurement SEM). A length measuring SEM explained in this embodiment is characterized by being equipped with an electric discharge function. FIG. 22 shows a schematic diagram of a length measuring SEM explained in this embodiment.

The length measuring SEM shown in FIG. 22 consists of an SEM column 34, a specimen chamber 9, a specimen preparation chamber 49, an SEM controller 35, an input unit 96, a specimen image display portion 95, a charge control system 58, and a vacuum system 52. The charge control column 1 that the charge control system 29 controls is attached to a ceiling part of the case of the specimen preparation chamber 49. The specimen preparation chamber 49 may be called a load chamber. Moreover, although not illustrated, a wafer stocker for hosing wafers is joined with the outside of the specimen preparation chamber 49 (left hand side tagged with the reference numeral 49 in the figure) via a conveyance arm for conveying a wafer. The wafer housed in the wafer stocker is conveyed to a processing apparatus for the next process (of a length measurement process) according to the purpose. The charge control column 1 and the specimen preparation chamber 49 shall be maintained by a vacuum pump A 97 controlled by the vacuum system 52 in such a degree of vacuum that enables charge control processing through vacuum piping 99. Moreover, the specimen chamber 9 and the SEM column 34 shall always be evacuated by a vacuum pump B 98 to such a degree of vacuum that makes length measurement realizable, as with the specimen preparation chamber 49. Incidentally, since an internal structure and functions of the charge control system 58 are the same as the structure and the functions shown in FIG. 2, their explanations are omitted. The process of length measurement is broadly divided into an "charge control processing process," a "length measurement process," and an "electric discharge processing process." The operator shall select freely the existence or absence of an "charge control processing process" and an "electric discharge processing process" in the input unit 96.

"Charge Control Processing Process"

This process is processing of forming an arbitrary voltage including 0 V that the operator sets on the surface of a specimen 89. The procedure of the process is as follows: the specimen 89, such as a semiconductor wafer, is housed in the specimen preparation chamber 49, the specimen preparation chamber 49 is evacuated to such a degree of vacuum that enables charge processing, and subsequently charge control processing is performed. After completion of the processing, a valve 48 is opened and the specimen 89 is attached on the stage 40. Here, the charge control processing shall be conducted by the same procedure as in the case of the above-mentioned embodiment, and the SEM controller 35 shall always monitor a status of progress of the processing, a voltage after the specimen 89 is processed, etc. For example, when the surface of the specimen 89 is set to 0V, charge control electrode 4 and the wafer holder 7 shown in FIG. 2 are set to the same potential (for example, if the wafer holder is 0 V, the charge control electrode 4 is set to about 0 V), and then charge control processing is conducted. The charge control processing explained previously is processing of controlling the surface potential of the specimen 89 to about 0 V. The charge control instrument of this invention can control the surface potential of the specimen 89 to an arbitrary potential.

Also in the CD-SEM, charge processing other than electric discharge processing may be needed. For example, it is a case where the length measurement is conducted on a semiconductor device in which a contact hole is formed by etching as a specimen. Form observation of a hole bottom is placed as an extremely important quality control technology in the semiconductor manufacture area. Conventionally, the hole bottom is observed by illuminating an electron beam used in SEM observation on a specimen prior to the observation to effect charge of an insulating film of the surface. Although this technology is an extremely effective technology to observe the hole bottom, there is a problem that it takes a time until it becomes ready for observation because charge processing is performed at each time of observation. On the contrary, in the case of using the charge control instrument of this invention, a large area can be processed at one time, and consequently desired charge can be formed and the hole bottom can be observed at a high speed.

"Length Measurement Process"

In this process, an SEM image of a part that the operator specified is acquired and length measurement of a pattern formed on the specimen 89 is conducted from the image. An instrument configuration of the SEM having a length measurement function is shown below. An electron gun 82 consists of an SE cathode 55, an extraction electrode 3, and an anode electrode 84. The SEM electron gun power supply 41 applies an extractor voltage V1 between the SE cathode 55 and the extraction electrode 3, by which an electron beam 83 is extracted from the SE cathode 55. The anode electrode 84 is maintained at the ground potential, the acceleration voltage Vacc is applied between the anode electrode 84 and the SE cathode 55 by the SEM electron gun power supply 41, and the electron beam 83 is accelerated to energy corresponding to the acceleration voltage Vacc approximately at a position of the anode electrode 84. The accelerated electron beam 83 is converged by the condenser lens A 56 connected with the SEM controller 35 so that a first crossover 85 may occur between the condenser lens A 56 and the condenser lens B 57 connected with the SEM controller 35. The condenser lenses A 56, B 57 are driven by the condenser lens control power supply 36.

The unnecessary area of the electron beam 83 is removed by an aperture plate 86 disposed between the first crossover 85 and the condenser lens B 57. Further, this electron beam 83 is so converged that a second crossover 87 may occur between the condenser lens B 57 and the objective lens 50, and finally focused on a specimen 89 such as semiconductor wafer etc. on the stage 40 made translatable horizontally by a stage drive device (not illustrated) and a position monitor 88 for position monitor. Moreover, the height position of the specimen 89 is detected by a height sensor 90, and this value is fed back to the objective lens 50, which automatically obtains correct focus. A deflector 5 is disposed to scan the electron beam between the second crossover 87 and the objective lens 50, and has a function of deflecting the electron beam 83 so that the specimen is two-dimensionally scanned with the focused electron beam 83. A scanning signal of the deflector 5 is controlled by the deflector control unit 91 according to an observation magnification. Moreover, a negative voltage is applied to the specimen 89 by a retarding power supply 92 as the retarding voltage that decelerates the electron beam 83. The retarding voltage can be altered arbitrarily by adjusting the retarding power supply 92. When the specimen 89 is irradiated and scanned by the focused electron beam 83, the specimen 89 generates the secondary electrons 24. The generated secondary electrons 24 are detected by a detector 47, and are amplified with a signal amplifier 93. The drawing unit 94 displays an image corresponding to the surface profile of the specimen as a specimen image on the specimen display unit 95 by controlling the detected secondary signal to be converted into a visible signal and properly aligned on another plane. The input unit 96 serves as an interface between the operator and the interface of the SEM controller 35. The operator specifies a measuring point and instructs dimensional measurement through the input unit 96, in addition to controlling the above-mentioned each unit.

"Electric Discharge Processing Process"

This process is a processing process for suppressing as much an ill effect of the charge generated as possible in a process next to the length measurement process. Since the specimen subjected to the length measurement charge control processing, etc. is charged to some degrees because of beam illumination and application of an electric potential, the specimen 89 needs to be discharged before it is returned to a wafer stocker. The specimen 89 that have gone through the length measurement process is returned to the specimen preparation chamber 49. At this time, the degree of vacuum in the specimen preparation chamber 49 is made roughly the same as the degree of vacuum of the specimen chamber 9 so that the degree of vacuum of the specimen chamber 9 would not deteriorate by an open/shut operation of a valve 48. The procedure of electric discharge processing is the same as that of the above-mentioned first embodiment; the charge control electrode 4 shown in FIG. 2 and the wafer holder 7 are made to have the same potential (if the wafer holder 7 is at 0 V, the charge control electrode 4 is set to about 0 V) and the same processing is performed as in the case of the first embodiment. Moreover, a progress situation of the processing is managed by the charge monitor 51 described in the previous embodiment. The specimen preparation chamber 49 is open to the air upon completion of electric discharge, and the specimen 89 is taken out therefrom.

The above-mentioned flow of the process shows a procedure of length measurement by the operator, and the "charge processing process" and the "electric discharge processing" can be appended or deleted as needed. The procedure of length measurement shown in this embodiment is also applicable to the automatic length measurement by a recipe, and its details will be described in a seventh embodiment 7 that will be shown later. Moreover, in the length measuring SEM of this embodiment, the charge control column 1 was disposed to the specimen preparation chamber 49. However, the charge control column 1 can be installed anywhere as long as it is in the middle of a conveyance system that connects the wafer stocker and the specimen chamber 9. For example, as the configurations of the first embodiment and the fourth embodiment, the charge control column 1 and the CNT electron gun 43 may be arranged in the specimen chamber 89 to perform the charge control processing and the electric discharge processing. However, when both the time difference between the electric discharge and the length measurement and occupying as little space as possible of the instrument are considered, a configuration where the specimen preparation chamber 49 is given a function of electric discharge is preferable.

As described above, the electron beam instrument can realize a CD-SEM capable of charge including electric discharge.

Sixth Embodiment

In this embodiment, automatic length measurement using scanning electron microscope incorporated with a charge control apparatus will be described. The automatic length measurement is composed of "process of recipe creation" by the operator and "process of automatic length measurement" using a recipe. Hereafter, each process will be explained. For convenience of explanation, the recipe creation of this embodiment shall be executed on the length measuring SEM shown in FIG. 22, and either a process of recipe creation or the process of automatic length measurement, as a whole, is controlled by the SEM controller 35. Moreover, although not illustrated in FIG. 22, an external server is connected with the SEM controller 35 or the drawing unit 94 and information having a large data size, such as recipe information, shall be stored in the external server in the length measuring SEM use in this embodiment. Furthermore, either the SEM controller 35 or the drawing unit 94 shall be equipped with a communication function depending on capability/incapability of connection with the server. Here, the communication function means, for example, software for controlling communication processing, a computer for executing the software, or a terminal the allows connection to communication line, and the is also a case where a function realized by the communication processing software is called a communication function in the explanation below.

"Process of Recipe Creation"

Figure 23:
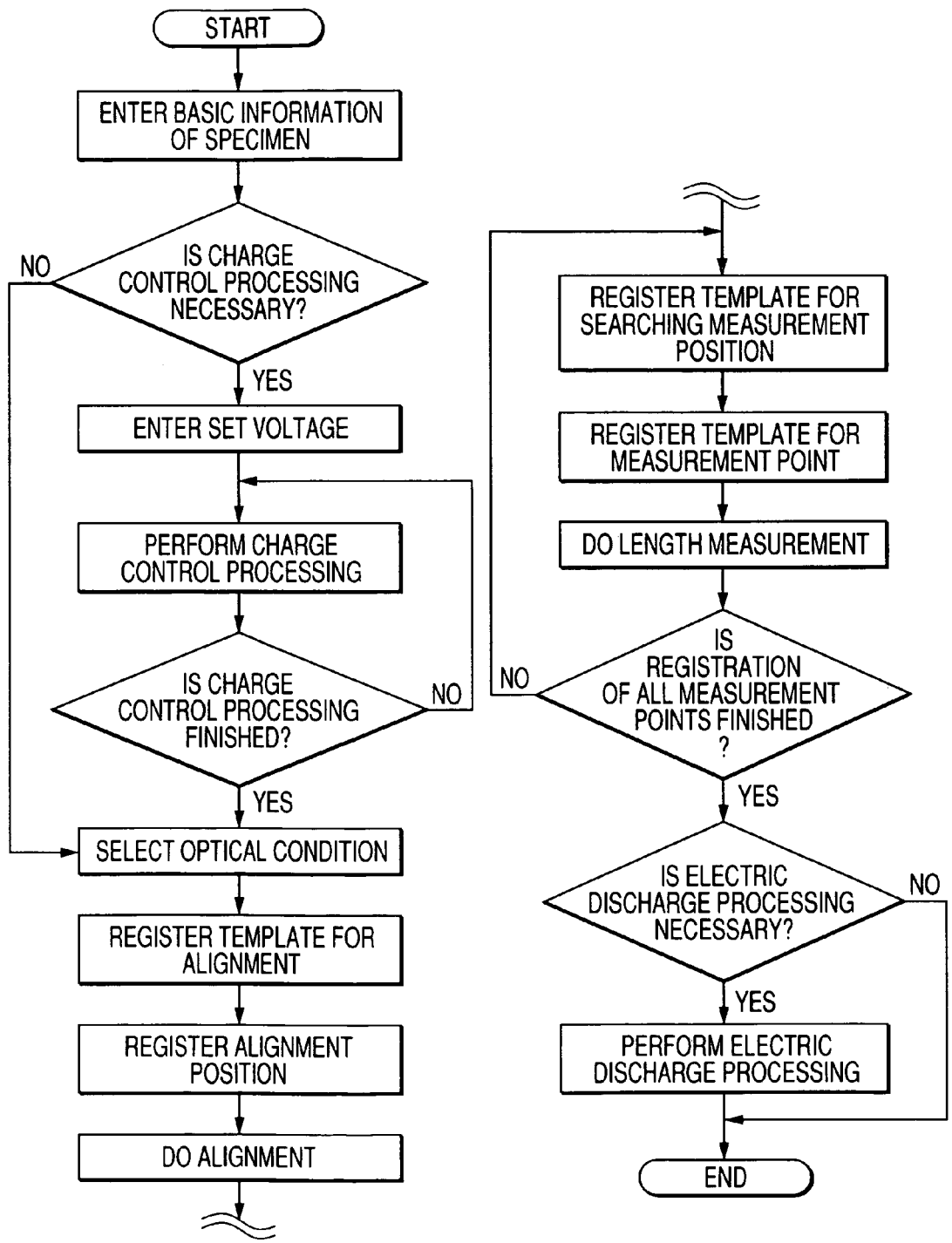
FIG. 23 is a diagram showing a recipe creation procedure of a CD-SEM equipped with a charge control function.

A creation procedure of a recipe is shown with FIG. 23.

(Step of Entering Basic Information of Specimen)

The user who wishes to conduct a length measurement of a specimen, first the operator shall enter information of the specimen whose length is to be measured. The instrument operator enters information into the length measurement apparatus using the input unit 96, while viewing an input screen shown in the image display portion 95 of FIG. 22. Here, in the case where the specimen is semiconductor wafer, the kind of wafer and a name of manufacturing process correspond to the above-mentioned information. These pieces of information entered by the user are used to classify and manage a plurality of existing recipes.

(Step of Determining Necessity of Charge Control Processing)

In the case where a specimen whose length is to be measured needs charge control processing, charge control processing is conducted according to the following procedure. If the charge control processing is unnecessary, the flow jumps to a "step of registering a template for alignment" shown in FIG. 23. The necessity of charge control processing can be determined by the operator, who enters the setting through the input unit 96 in FIG. 22. The instrument may determine the necessity of the charge control processing automatically from the basic information of the specimen described above. There are two kinds of methods whereby the instrument determines the necessity automatically.

The One is a method with whereby the instrument determines the existence of the processing referring to recipes created in the past. Although the recipe is stored in the external server, it may be stored in another external storage devise different from the server that is connected with the SEM controller 35. Alternatively, the SEM controller 35 or other device constituent may be provided with storage means, such as memory, which may store the recipes. The SEM controller 35 calls a recipe from the external server or external storage device according to the basic information that the instrument operator entered.

Another method is that a manufacturer of the instrument make the instrument stores a correspondence table of the existence of the charge control processing at the time of instrument shipping of the length measuring SEM and the instrument determined the existence of the charge control based on the correspondence table. For example, in the case where the specimen is a semiconductor wafer, a name of a process reflects a structure of the wafer surface and its material, and accordingly for each name a correspondence table of the charge control processing is created and the instrument is made to stores it.

In the case where this methods is actually implemented in the instrument, the external storage device is connected with the SEM controller 35 of FIG. 22, which is made to store the correspondence tables. The SEM controller 35 refers the above-mentioned correspondence table using a name of the production process that the instrument operator entered as a reference key and determined whether the charge control processing is necessary or unnecessary for the specimen produced in the production process in concern.

For an instrument that adopts this method, each time a new production process is developed the correspondence table needs to be updated. For this reason, a portable storage media is used as an external storage device, the correspondence tables are stored in the portable storage media. Since this method enables the correspondence table to be updated simply by changing the recording medium when the correspondence table is updated, updating operation becomes simple. Alternatively, if the whole length measuring system is configured to be able to down load it from the external server that stores new correspondence in it when the correspondence table is updated, the updating operation of the correspondence table will become further simpler. Incidentally, here, the "length measuring system" means a system that is constructed with the length measuring SEM, the external server, and communication circuit, and includes other system constituent as far as it relates to length measurement.

(Step of Entering a Set Voltage)

In the cased where charge control processing is necessary, the operator enters a set voltage suitable for length measurement. Here, the set voltage suitable for length measurement is fixed so as not to generate "degradation in SEM image quality caused by taking a plurality of images such as frame addition" and "abnormal contrast, such as brightness unevenness that will cause an adverse effect at the time of length measurement."

Since a probe current at the time of taking an image is generally small in the scanning electron microscope equipped with a length measurement function, it is sufficient to select 0 V as the set voltage of the charge control processing for most specimens, i.e., to perform the electric discharge processing. This set voltage is treated in the same way as "determination of existence of charge control processing" described previously; the instrument stores each set voltage for each created recipe.

(Step of Conducting Charge Control Processing)

Charge control processing is so conducted that the specimen has desired charge corresponding to a set voltage.

Since details of the charge control processing are the same as were explained in FIG. 2 or in the sixth embodiment, their explanations are omitted.

(Step of Selecting Optical Conditions)

In this step, optical conditions used in conducting the length measurement are selected. Parameters of the optical conditions are a probe current for an electron beam incident on the specimen, a field of view when taking an image, incident energy, and an electric field strength formed on the specimen, all of which are so determined that there do not occur "degradation in SEM image quality caused by taking a plurality of images such as frame addition" and "abnormal contrast, such as brightness unevenness, that will become a hindrance at the time of length measurement."

This operation may be done by the operator selecting optical conditions arbitrarily or by using recommended conditions determined by a manufacturer at the time of shipping the instrument, in the same fashion as the charge control processing.

(Step of Registering a Template for Alignment)

In a specimen on which a pattern was formed, such as a semiconductor wafer, it is necessary to measure exactly a spatial relationship between coordinates of a stage for moving the specimen and coordinates of a pattern formed on the specimen. In this embodiment, a process for measuring this positional relationship is designated as an alignment process. Here, an image of a pattern on the specimen that is recognizable on an optical image and an SEM image is registered as a template in an external server. The template may be registered in an external storage device connected with the SEM controller 35. In this template, two kinds of images, i.e., an optical image and an SEM image, can be registered. The template of an optical image will be used in the first alignment process and the template for an SEM image will be used in the second alignment process. Usually, a procedure is as follows: first the first alignment of low precision is done, and then the second alignment of high precision is done. A registration operation is conducted, for example, by the instrument operator selecting an optical image and an SEM image displayed on the image display portion 95 with the input unit 96.

(Step of Registering an Alignment Position)

In order to correct accurately the spatial relationship between the coordinates of the stage and the coordinates of the pattern formed on the specimen, it is necessary to conduct the alignment process at least two locations. In this step, a location where the alignment is done is registered. The registration is conducted, for example, by the instrument operator selecting a proper position on the SEM image displayed in the image display portion 95 though the input unit 96.

(Step of Executing Alignment)

In this step, the spatial relationship of the coordinates of the stage and the coordinates of the pattern is measured by the template and comparison between an optical image and an SEM image taken at the location registered as described above.

(Step of Registering Template for Searching a Measuring Position)

Next, a template for searching a measuring point used to search a location for length measurement in the vicinity of a pattern whose length is to be measured is registered. The template for searching a measuring position is stored in the external server as with the template for alignment, but the template may also be registered in an external storage device connected with the SEM controller 35. The registration work is conducted in the same fashion as at the time of registering the template for alignment. The information registered as a template is a low-magnification SEM image and stage coordinates. In the processing to find a location where measurement will be done, a position is determined by taking a low-magnification SEM image after the stage is moved to registered stage coordinates, and matching the SEM image with a registered image.

(Step of Registering a Template for Measuring Point)

After registering the template for searching a measuring point, the template for searching a location for length measurement is registered in the external server. Here, an image registered as a template shall be an image of almost the same magnification as the image-taking magnification of the SEM when dimensions of the pattern are measured. The work to be done at the time of registration is the same as the registration work of the template for alignment and the template for searching a measuring position.

(Step of Doing Length Measurement)

After registering the template for a measuring point, the length measurement at the measuring point is done and the instrument stores the result. Here, stored information may be only information of dimensions obtained by the length measurement, or may be the information of dimensions added with an SEM image.

(Step of Determining Necessity of Electric Discharge Processing)

When the instrument determines that length measurement is ended, the flow proceeds to a step of determining necessity of electric discharge processing. This determination may be done as in the case of the charge processing, i.e., either by the operator determining the necessity, or by the instrument as with the above-mentioned charge processing. If the electric discharge processing is unnecessary, the specimen is taken out without any processing and the recipe creation is ended.

(Performing Electric Discharge Processing)

Electric discharge processing is performed so that the surface potential of the specimen may become approximately 0 V. Since the details of the electric discharge processing are as were explained in the sixth embodiment, their explanations are omitted. When the electric discharge processing is ended, a specimen is taken out and recipe creation is ended. "Process of automatic length measurement" Next, using FIG. 24, a procedure of automatic length measurement using the recipe will be explained.

(Step of Reading a Recipe File)

In the start of this step, first, the operator enters basic information of a specimen whose length is to be measured. Based on the basic information entered, the instrument reads a proper recipe from the external server and starts the automatic length measurement. Since the length measuring SEM automatically executes processing after the entry of the basic information based on the recipe, the operator is not troubled with the processing.

(Step for Determining Necessity of Charge Control Processing) to (Step of Conducting Charge Control Processing)

If charge processing is necessary, charge control processing is conducted according to a set voltage recorded in the recipe (set voltage). If the processing is unnecessary, the flow moves to the process of alignment.

(Alignment)

Align is done based on information of the alignment point recorded in the recipe, and the spatial relationship between the stage coordinates and the pattern coordinates of the specimen are corrected.

(Step of Moving to a Measuring Position)

Next, a location is tried to be found based on the coordinates recorded as the template for searching a measuring position and the low-magnification SEM image. When position coordinates of the measuring point become clear, the SEM controller 35 drives the stage driving device and moves the stage 40 so that a measuring point on the specimen coincides with an illumination area of the primary electron beam.

(Step of Length Measurement)

Measurement is done based on the template of the measuring point recorded in the recipe. Only dimensions of the result may be stored in the same fashion as the "Execution of length measurement" described above, but may be stored being attached with an image. When the measurement is completed, the stage 40 moves the specimen to the next length measuring point and subsequently the length measurement is done by the same procedure as described above.

(Step of Determining Necessity of Electric Discharge Processing)

When all the measurements was ended and further the electric discharge processing is intended to be done, the specimen is taken out after the electric discharge processing was performed and the process of automatic length measurement is ended. On the other hand, if the electric discharge processing is unnecessary, after the measurement was ended, the specimen, as it is, is taken out and the process of automatic length measurement is ended.

Figure 24:
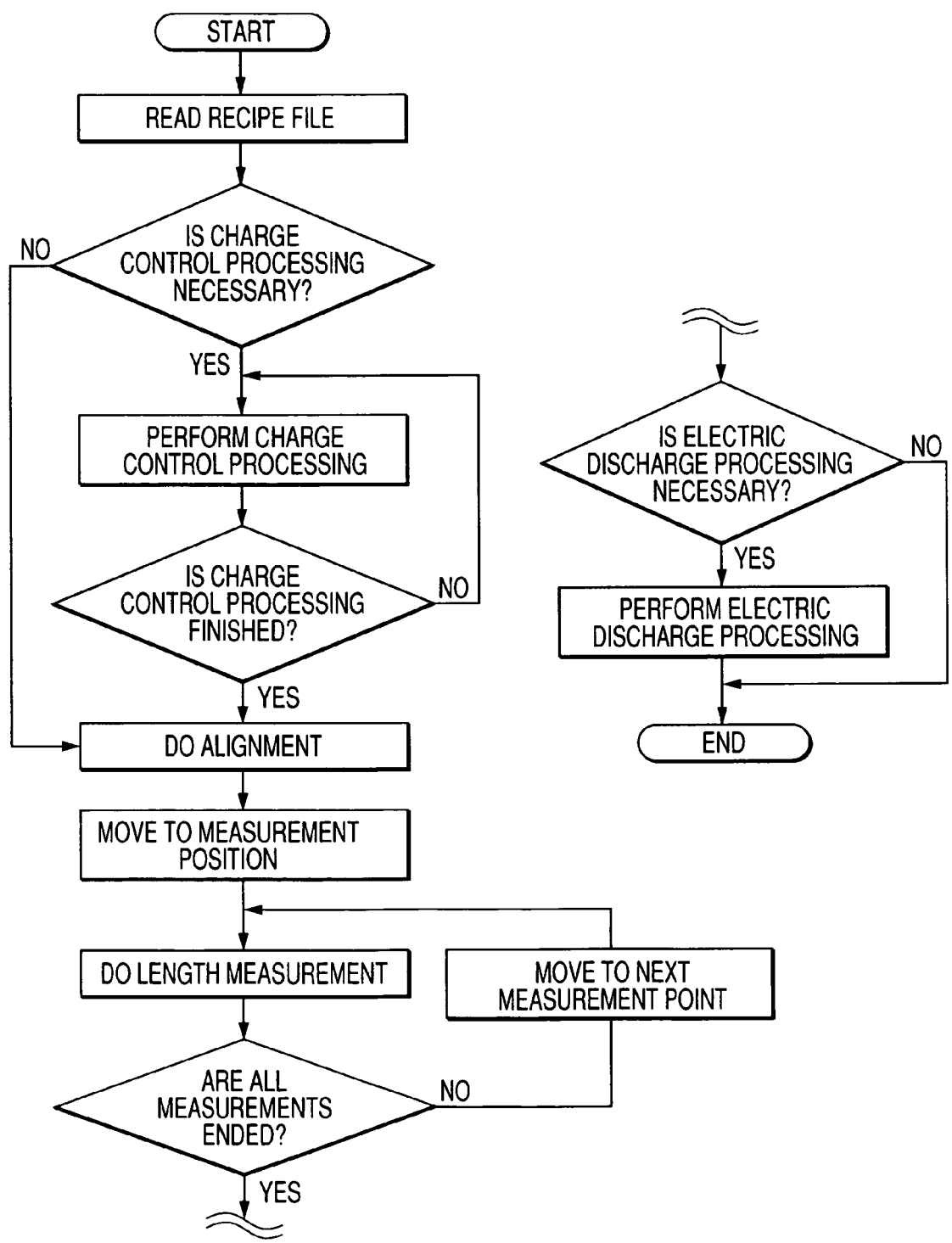
FIG. 24 is a diagram showing a procedure of automatic length measurement using a recipe.

The steps described in the foregoing are installed in the measurement device as software or using hardware, whereby measurement accompanied with charge control processing becomes e realizable. Especially, storing the determination of necessity of the charge control processing or the electric discharge processing makes it possible to omit unnecessary charge control processing or electric discharge processing. This has an effect in improving throughput of the measurement. Especially, when installing the length measuring SEM in a mass production line for manufacturing a semiconductor device, the effect is large. As the software installation described above, for example, software for charge control is stored in an external storage device, such as memory, provided in the SEM controller 35 shown in FIG. 22. As the hardware installation, it is considered preferable that an exclusive chip for making the SEM controller 35 execute several steps as shown in FIG. 23 or FIG. 24 is incorporated therein.

In the charge control device according to this invention, charge of the specimen surface can be controlled at high speed and with high precision. In the case where the charge control apparatus of this invention is applied to a measurement apparatus of a semiconductor wafer, charge of the wafer surface can always be rendered uniform and consequently high-precision measurement and high repeatability can be realized. Moreover, in the case where this instrument is applied to the SEM type inspection instrument, a pattern formed on the wafer surface can be electrified so as to have a desired potential, and consequently a defect of electric characteristics can be detected highly sensitive.

What is claimed is:

1. A specimen inspection instrument, comprising:
    a specimen stage for holding an inspection specimen;
    an SEM column that irradiates a primary electron beam on the specimen held on the specimen toolslide and detects a signal resulting from generated secondary electrons;
    an SEM controller for controlling the SEM column,
    a charge control column for controlling an electrified state of the specimen; and
    an image formation unit that processes the signal detected by the SEM column and inspects the specimen;
    wherein:
        the SEM column is equipped with a first electron source for generating the primary electron beam,
        the charge control column is equipped with a second electron source different from the first electron source for charging the inspection specimen, and means for observing an electrified state of the specimen,
        the second electron source irradiates a second electron beam having an optical axis perpendicular to the surface of the inspection specimen; and the charge control column is rotated about an axis parallel to the optical axis of the second electron beam irradiated from the second electron source to the inspection specimen.

2. The specimen inspection instrument according to claim 1, wherein
electrons emitted from the CNT cathode are almost perpendicularly incident on the specimen.

3. The specimen inspection instrument according to claim 1, wherein
none of the plurality of ONT cathodes are disposed not to be within an angle range that any arbitrary point on the specimen can see.

4. The specimen inspection instrument according to claim 1, wherein
the charge control column has
a vacuum chamber for housing the second electron source in its inside, an charge control electrode disposed in a position that faces the specimen; an aperture
provided between the second electron source and the electrode for charge control, and a port for evacuation provided in a position nearer the second electron source that a position of the aperture.

5. The specimen inspection instrument according to claim 1,
the charge control column is equipped with a vacuum chamber for housing a second electron source in its inside, wherein
the vacuum chamber is equipped with a differential pumping structure acting in such a way that the degree of vacuum around the second electron source is higher that the degree of vacuum around the specimen.

6. The specimen inspection instrument according to claim 1, wherein
the charge control column has an charge control electrode provided facing the specimen, and
a charge control system for determining whether charge of the specimen has reached saturation by temporal variation of an absorption current observed with the charge control electrode.

7. The specimen inspection instrument according to claim 6, wherein
the charge control electrode has a structure of an insulator sandwiched with two sheets of the ground electrode.

8. The specimen inspection instrument according to claim 1, wherein
the charge control column is equipped with means for observing an absorption current flowing into the specimen,
the specimen inspection instrument having an charge control system for determining whether charge of the specimen has reached saturation by temporal variation of an absorption current.

9. The specimen inspection instrument according to claim 1, wherein
the charge control column is equipped with detection means for detecting the secondary electrons or backscattered electrons generated by electron beam illumination from the secondary electron source, and
an charge control system for determining whether charge of the specimen has reached saturation based on the amount of detection of the secondary electron or backscattered electron.

10. The specimen inspection instrument according to claim 1, wherein
the charge control column is equipped with means for altering a relative position of the second electron source to the specimen.

11. The specimen inspection instrument according to claim 10, wherein
at least one or more techniques of scanning the electron beam, moving the electron source, and moving the specimen are used as means for altering the relative position.

12. The specimen inspection instrument according to claim 1, wherein
the charge control column is equipped with a plurality of charge control units for conducting charge control on a partial area of the specimen and an charge control system for determining whether charge of the specimen has reached saturation by temporal variation of absorption currents observed by the plurality of charge control units, and
the charge control unit is equipped with an charge control electrode provided facing the specimen and a second electron source.

13. The specimen inspection instrument according to claim 1, comprising
a user interface for setting up an charge control target value of the specimen.

14. The specimen inspection instrument according to claim 1, wherein the second electron source is constructed with a plurality of CNT cathodes.

* * * * *